(12) United States Patent
Kim et al.

(10) Patent No.: US 11,637,081 B2
(45) Date of Patent: Apr. 25, 2023

(54) SEMICONDUCTOR PACKAGE AND METHOD OF MANUFACTURING THE SAME

(71) Applicant: Samsung Electronics Co., Ltd., Suwon-si (KR)

(72) Inventors: Jongyoun Kim, Seoul (KR); Jungho Park, Cheonan-si (KR); Seokhyun Lee, Hwaseong-si (KR); Yeonho Jang, Goyang-si (KR); Jaegwon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 17/474,614

(22) Filed: Sep. 14, 2021

(65) Prior Publication Data
US 2021/0407940 A1    Dec. 30, 2021

Related U.S. Application Data

(63) Continuation of application No. 16/795,795, filed on Feb. 20, 2020, now Pat. No. 11,145,611.

(30) Foreign Application Priority Data

Jun. 28, 2019    (KR) .......................... 10-2019-0078341

(51) Int. Cl.
*H01L 23/00* (2006.01)
*H01L 23/498* (2006.01)
(Continued)

(52) U.S. Cl.
CPC ........ *H01L 24/06* (2013.01); *H01L 21/76823* (2013.01); *H01L 23/49827* (2013.01);
(Continued)

(58) Field of Classification Search
CPC ............... H01L 24/06; H01L 21/76823; H01L 23/49827; H01L 24/03; H01L 25/0655;
(Continued)

(56) References Cited

U.S. PATENT DOCUMENTS 7,915,088 B2    3/2011  Kobayashi et al.
9,425,178 B2    8/2016  Lin et al.
(Continued)

FOREIGN PATENT DOCUMENTS

CN    109585410 A    4/2019
JP    2017034059 A    2/2017
(Continued)

*Primary Examiner* — Douglas W Owens
(74) *Attorney, Agent, or Firm* — Muir Patent Law, PLLC

(57) ABSTRACT

A semiconductor package includes a redistribution structure including a redistribution insulating layer and a redistribution pattern, a semiconductor chip provided on a first surface of the redistribution insulation layer and electrically connected to the redistribution pattern, and a lower electrode pad provided on a second surface opposite to the first surface of the redistribution insulating layer, the lower electrode pad including a first portion embedded in the redistribution insulating layer and a second portion protruding from the second surface of the redistribution insulating layer, wherein a thickness of the first portion of the lower electrode pad is greater than a thickness of the second portion of the lower electrode pad.

20 Claims, 22 Drawing Sheets

(51) Int. Cl.
*H01L 21/768* (2006.01)
*H01L 25/065* (2006.01)

(52) U.S. Cl.
CPC .......... *H01L 24/03* (2013.01); *H01L 25/0655* (2013.01); *H01L 2224/0233* (2013.01); *H01L 2224/02333* (2013.01); *H01L 2224/0603* (2013.01)

(58) Field of Classification Search
CPC ... H01L 2224/0233; H01L 2224/02333; H01L 21/568; H01L 21/6835; H01L 2221/68345; H01L 2224/73253; H01L 23/49822; H01L 24/02
See application file for complete search history.

(56) References Cited

U.S. PATENT DOCUMENTS

| | | | |
|---|---|---|---|
| 9,922,845 | B1 | 3/2018 | Shih |
| 10,026,668 | B1 | 7/2018 | Lee et al. |
| 10,217,716 | B2 | 2/2019 | Yu et al. |
| 10,262,932 | B2 | 4/2019 | Furuichi et al. |
| 10,504,835 | B1 | 12/2019 | Wang et al. |
| 10,504,865 | B2 | 12/2019 | Liu et al. |
| 2008/0315372 | A1* | 12/2008 | Kuan ........................ H01L 24/97 257/737 |
| 2008/0315385 | A1* | 12/2008 | Gerber ................. H01L 21/565 257/E21.511 |
| 2008/0316714 | A1* | 12/2008 | Eichelberger ........ H05K 1/0218 361/728 |
| 2011/0198748 | A1 | 8/2011 | Koike |
| 2014/0124949 | A1 | 5/2014 | Paek et al. |
| 2015/0221601 | A1 | 8/2015 | Kim et al. |
| 2015/0325497 | A1 | 11/2015 | Yu et al. |
| 2015/0380334 | A1 | 12/2015 | Hu et al. |
| 2016/0013124 | A1 | 1/2016 | Chen et al. |
| 2017/0033036 | A1 | 2/2017 | Kajihara et al. |
| 2018/0158777 | A1 | 6/2018 | Chen et al. |
| 2019/0013273 | A1 | 1/2019 | Jeng et al. |
| 2019/0103379 | A1 | 4/2019 | Yu et al. |
| 2019/0131285 | A1 | 5/2019 | Kim et al. |
| 2019/0172809 | A1 | 6/2019 | Oh |
| 2020/0105678 | A1 | 4/2020 | Keser et al. |
| 2020/0105695 | A1 | 4/2020 | Hu et al. |

FOREIGN PATENT DOCUMENTS

| | | |
|---|---|---|
| JP | 2017157666 A | 9/2017 |
| KR | 1020190004598 A | 1/2019 |
| TW | 201911515 A | 3/2019 |
| TW | 201917846 A | 5/2019 |

\* cited by examiner

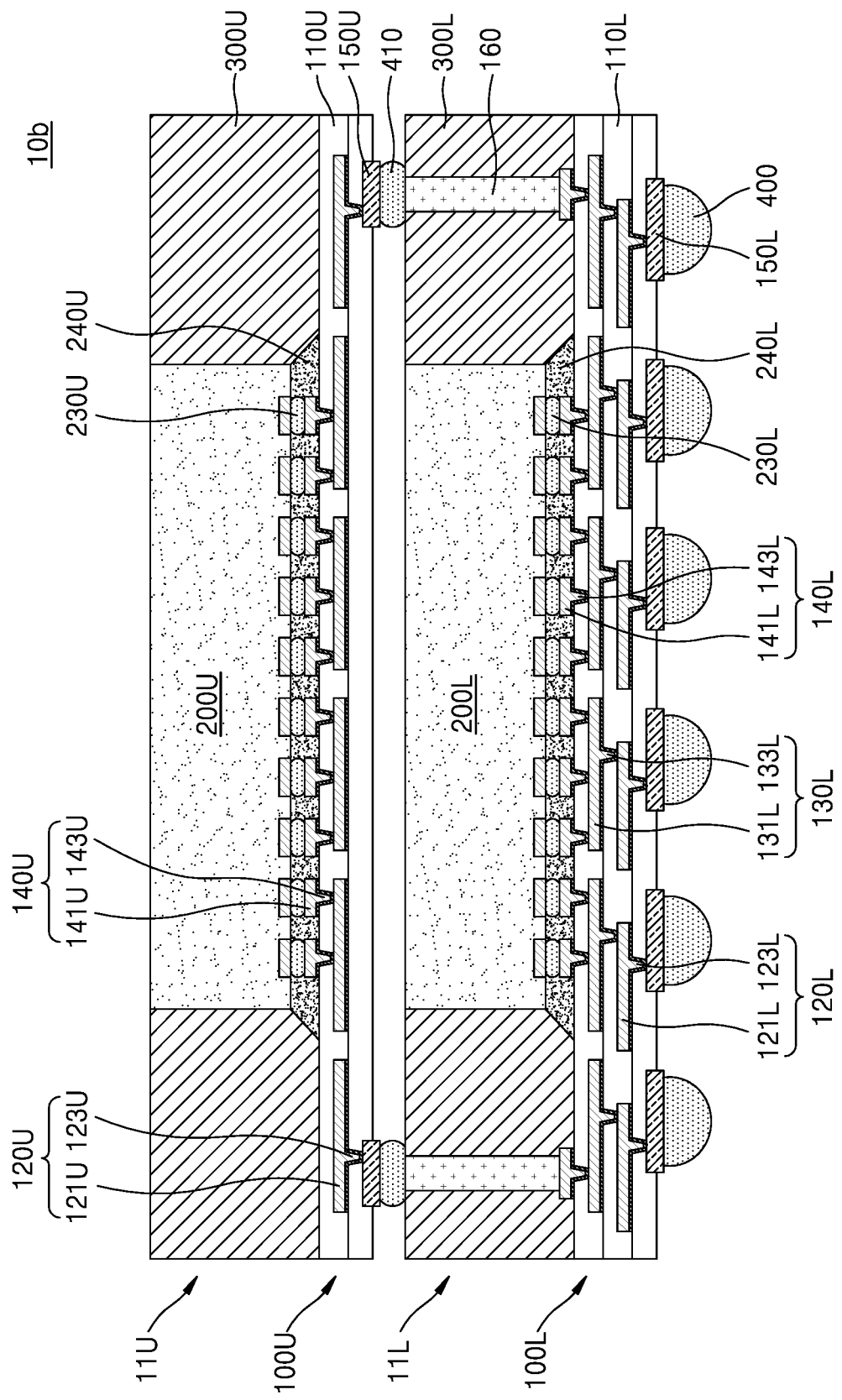

SEMICONDUCTOR PACKAGE AND METHOD OF MANUFACTURING THE SAME

CROSS-REFERENCE TO RELATED APPLICATION

This application is a continuation application of U.S. patent application Ser. No. 16/795,795, filed Feb. 20, 2020, which claims the benefit of priority under 35 U.S.C. § 119 to Korean Patent Application No. 10-2019-0078341, filed on Jun. 28, 2019, in the Korean Intellectual Property Office, the disclosure of each of which is incorporated herein in its entirety by reference.

BACKGROUND

The inventive concept relates to a semiconductor package and a method of manufacturing the semiconductor package, and more particularly, to a fan-out semiconductor package and a method of manufacturing the fan-out semiconductor package. For example, the disclosure is related to a method and a device of fan-out wafer level packaging (FOWLP).

Recently, as the demand for portable devices has rapidly increased in the electronic products market, miniaturization and weight lightening of electronic components mounted in these electronic products have been continuously required. For the miniaturization and weight lightening of electronic components, it is beneficial for semiconductor packages mounted thereon to have smaller volumes while capable of processing high amounts of data. In particular, in a highly integrated semiconductor chip having an increased number of input and output (I/O) terminals, an interval between the input and output terminals may be reduced, and thus, interference between the input and output terminals may occur. In order to eliminate such interference between the input and output terminals, a fan-out semiconductor package with an increased interval between the input and output terminals is beneficial.

SUMMARY

The inventive concept provides a semiconductor package with improved reliability and a method of manufacturing the semiconductor package.

According to an aspect of the inventive concept, there is provided a semiconductor package including: a redistribution structure including a redistribution insulating layer and a redistribution pattern, a semiconductor chip provided on a first surface of the redistribution insulating layer and electrically connected to the redistribution pattern, and a lower electrode pad provided on a second surface opposite to the first surface of the redistribution insulating layer, the lower electrode pad including a first portion embedded in the redistribution insulating layer and a second portion protruding from the second surface of the redistribution insulating layer, wherein a thickness of the first portion of the lower electrode pad is greater than a thickness of the second portion of the lower electrode pad.

According to an aspect of the inventive concept, there is provided a semiconductor package including: a redistribution insulating layer including a first surface and a second surface opposite to each other, a first conductive line pattern in the redistribution insulating layer, a second conductive line pattern on the first surface of the redistribution insulating layer, a lower electrode pad including a first portion embedded in the redistribution insulating layer and a second portion protruding from the second surface of the redistribution insulating layer, a first conductive via pattern extending between the first conductive line pattern and the lower electrode pad and in contact with the lower electrode pad, a second conductive via pattern extending between the second conductive line pattern and the first conductive line pattern, and a semiconductor chip disposed on the redistribution insulating layer and electrically connected to the second conductive line pattern.

According to an aspect of the inventive concept, there is provided a semiconductor package including: a redistribution structure including a plurality of insulating layers, a plurality of conductive line patterns disposed on an upper surface of each of the plurality of insulating layers, and a plurality of conductive via patterns penetrating at least one of the plurality of insulating layers and connected to at least one of the plurality of conductive line patterns, a semiconductor chip on an upper surface of the redistribution structure, a chip connection terminal interposed between the semiconductor chip and a conductive line pattern of an uppermost layer of the plurality of conductive line patterns, an underfill material layer surrounding the chip connection terminal between the semiconductor chip and the redistribution structure, a molding layer covering at least a portion of the semiconductor chip, a lower electrode pad on a bottom surface of the redistribution structure, and an external connection terminal on the lower electrode pad, wherein the lower electrode pad includes a first portion embedded in a lowermost insulating layer of the plurality of insulating layers and a second portion protruding from the lowermost insulating layer, and a thickness of the second portion of the lower electrode pad is less than a thickness of the first portion of the lower electrode pad.

According to an aspect of the inventive concept, there is provided a method of manufacturing a semiconductor package, the method including: forming a cover insulating layer on a carrier substrate, forming a lower electrode pad on the cover insulating layer, forming a redistribution structure including a redistribution insulating layer covering the lower electrode pad and a redistribution pattern electrically connected to the lower electrode pad, placing a semiconductor chip on the redistribution structure, removing the carrier substrate, and removing the cover insulation layer and removing a portion of the redistribution insulation layer to expose a portion of a sidewall of the lower electrode pad.

BRIEF DESCRIPTION OF THE DRAWINGS

Embodiments of the inventive concept will be more clearly understood from the following detailed description taken in conjunction with the accompanying drawings in which:

FIG. 7 is a cross-sectional view illustrating a semiconductor package according to an example embodiment of the inventive concept.

DETAILED DESCRIPTION OF THE EMBODIMENTS

Figure 1:
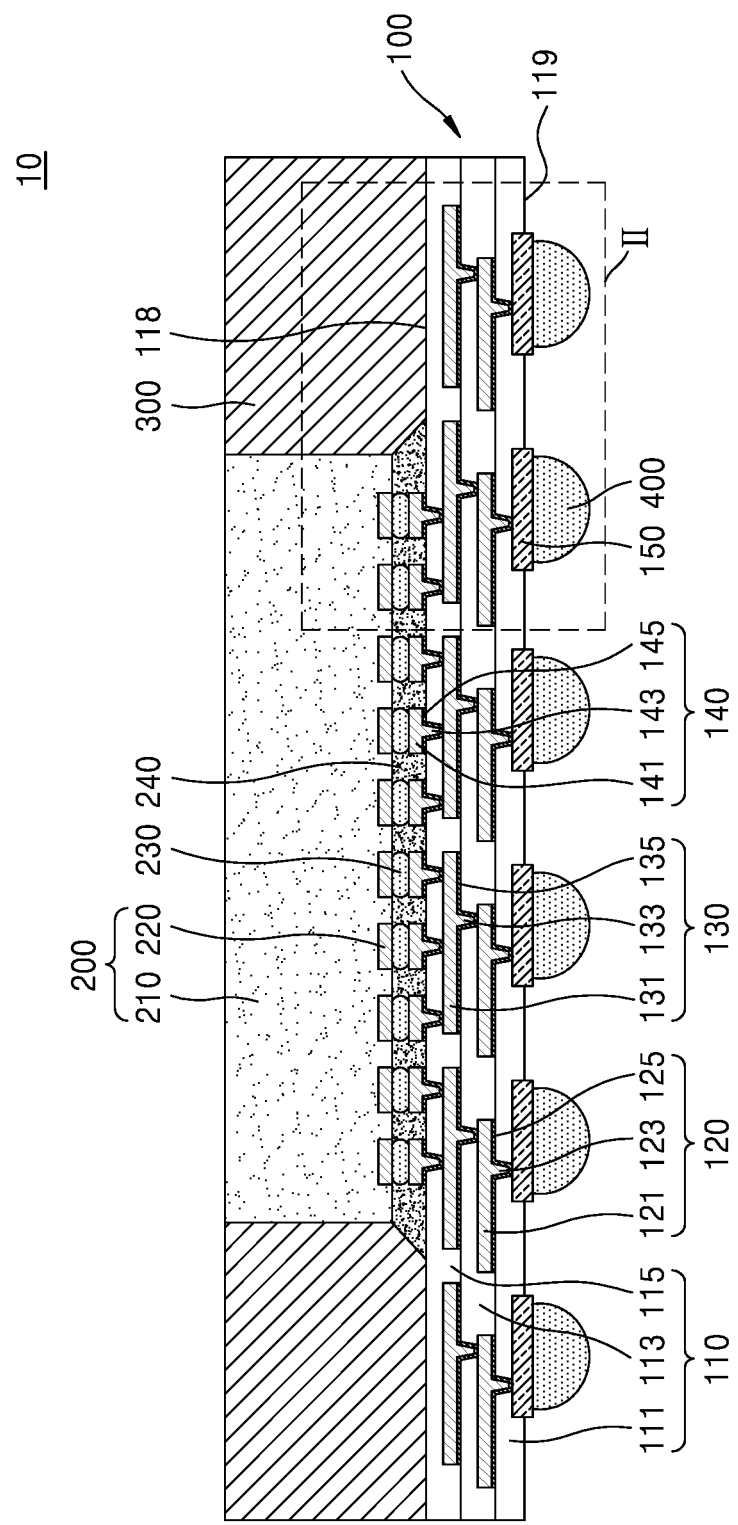
FIG. 1 is a cross-sectional view illustrating a semiconductor package according to an example embodiment of the inventive concept.

Hereinafter, example embodiments of the inventive concept will be described in detail with reference to the accompanying drawings. The same reference numerals are used for the same elements in the drawings, and redundant description thereof will be omitted.

Figure 2:
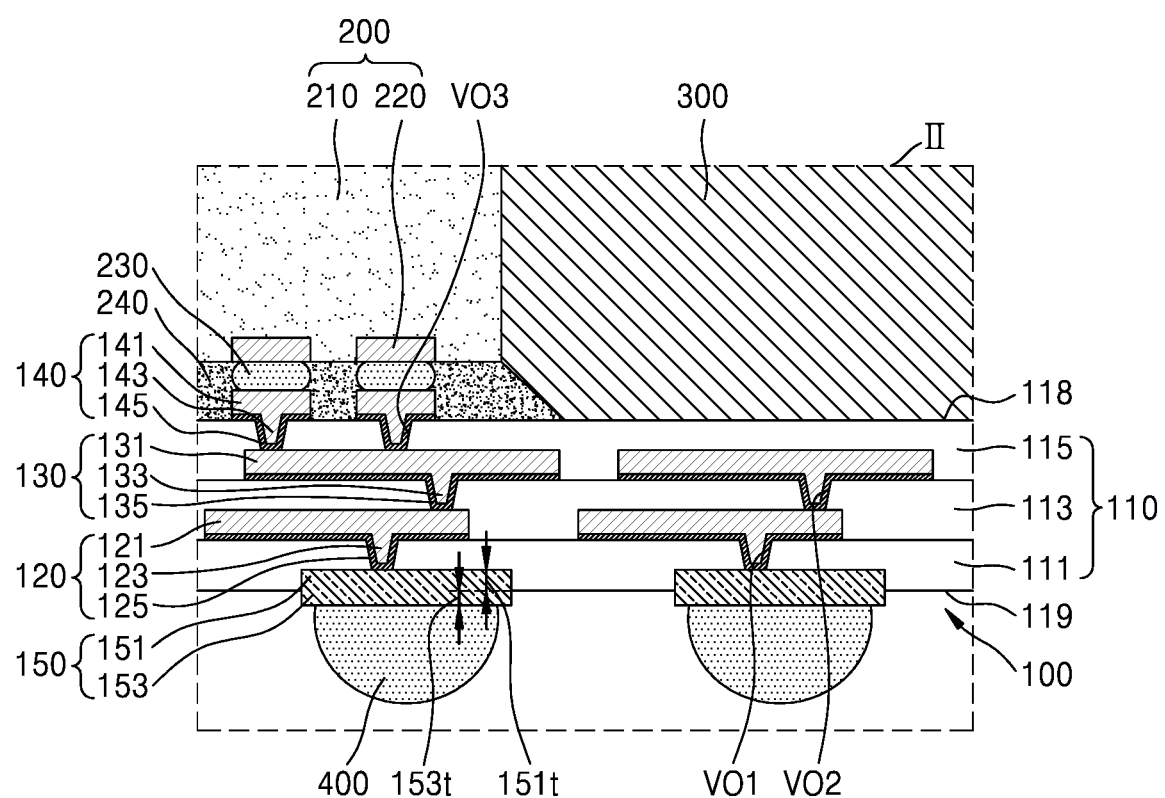
FIG. 2 is an enlarged cross-sectional view of an area "II" in FIG. 1 according to an example embodiment of the inventive concept.

FIG. 1 is a cross-sectional view illustrating a semiconductor package 10 according to an example embodiment of the inventive concept. FIG. 2 is an enlarged cross-sectional view of an area "II" of FIG. 1, according to an example embodiment of the inventive concept.

Referring to FIGS. 1 and 2, the semiconductor package 10 may include a redistribution structure 100, a semiconductor chip 200 provided on an upper side of the redistribution structure 100, and a lower electrode pad 150 provided on a lower side of the redistribution structure 100.

The redistribution structure 100 may include a redistribution insulating layer 110 and a plurality of redistribution patterns 120, 130, and 140.

The redistribution insulating layer 110 may include a plurality of insulating layers 111, 113, and 115. Each of the plurality of insulating layers 111, 113, and 115 may include, for example, a material film including an organic compound. In example embodiments, each of the plurality of insulating layers 111, 113, and 115 may include a material film including an organic polymer material. In example embodiments, each of the plurality of insulating layers 111, 113, and 115 may include an insulating material, wherein the insulating material may include a photoimageable dielectric (PID) material capable of being used in a photolithography process. For example, each of the plurality of insulating layers 111, 113, and 115 may include photosensitive polyimide (P SPI). In example embodiments, each of the plurality of insulating layers 111, 113, and 115 may include oxide or nitride.

The plurality of redistribution patterns 120, 130, and 140 may include a plurality of conductive line patterns 121, 131, and 141, and a plurality of conductive via patterns 123, 133, and 143. The plurality of conductive line patterns 121, 131, and 141 may be disposed on at least one surface of an upper surface and a lower surface of each of the plurality of insulating layers 111, 113, and 115. The plurality of conductive via patterns 123, 133, and 143 may penetrate at least one of the plurality of insulating layers 111, 113, and 115. The plurality of conductive via patterns 123, 133, and 143 may be connected to at least one of the plurality of conductive line patterns 121, 131, and 141, and/or may be connected to the lower electrode pad 150.

A plurality of seed layers 125, 135, and 145 may be respectively interposed between the plurality of insulating layers 111, 113, and 115 and the plurality of conductive line patterns 121, 131, and 141, and may be respectively interposed between the plurality of insulating layers 111, 113, and 115 and the plurality of conductive via patterns 123, 133, and 143. In example embodiments, the plurality of seed layers 125, 135, and 145 may be formed by performing physical vapor deposition, and the plurality of conductive line patterns 121, 131, and 141 and the plurality of conductive via patterns 123, 133, and 143 may be formed with electroless plating processes, e.g., chemical plating processes or auto-catalytic plating processes.

For example, the plurality of seed layers 125, 135, and 145 may be selected from a group comprising of copper (Cu), titanium (Ti), titanium tungsten (TiW), titanium nitride (TiN), tantalum (Ta), tantalum nitride (TaN), chromium (Cr), aluminum (Al), and the like. However, the plurality of seed layers 125, 135, and 145 are not limited to these materials. In example embodiments, the plurality of seed layers 125, 135, and 145 may include Cu/Ti having copper stacked on titanium, or Cu/TiW having copper stacked on titanium tungsten.

The plurality of conductive line patterns 121, 131, and 141 and the plurality of conductive via patterns 123, 133, and 143 may include a metal such as copper (Cu), aluminum (Al), tungsten (W), titanium (Ti), and tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof, but are not limited thereto. In example embodiments, when the plurality of conductive line patterns 121, 131, and 141 and the plurality of conductive via patterns 123, 133, and 143 include copper (Cu), at least a portion of the plurality of seed layers 125, 135, and 145 may act as a diffusion barrier layer. For example, the diffusion barrier layer may prevent/reduce diffusion of the material of the conductive line patterns 121, 131 and 141 and/or the conductive via patterns 123, 133 and 143 into the insulating layers 111, 113 and 115.

A portion of the plurality of conductive line patterns 121, 131, and 141 may be formed together with a portion of the plurality of conductive via patterns 123, 133, and 143 to form a single body. For example, the portion of the plurality of conductive line patterns 121, 131, and 141 may be formed to be the single body with the portion of the plurality of conductive via patterns 123, 133, and 143, which is in contact with a lower side of the portion of the plurality of conductive line patterns 121, 131, and 141. Alternatively, the portion of the plurality of conductive line patterns 121, 131, and 141 may be formed as a single body with the portion of the plurality of conductive via patterns 123, 133, and 143, which is in contact with an upper side of the portion of the plurality of conductive line patterns 121, 131, and 141. In some embodiments, each of the conductive via patterns 123, 133 and 143 may be integrated with a corresponding one of the conductive line patterns 121, 131 and 141 disposed above to form a continuing body as shown in FIG. 1. In certain embodiments, each of the conductive via patterns 123, 133 and 143 may be integrated with a corresponding conductive line pattern 121, 131 or 141 disposed below to form a continuing body, which is different from FIG. 1.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

The configuration of the redistribution structure 100 will be described in more detail below.

The redistribution insulating layer 110 may include a first insulating layer 111, a second insulating layer 113, and a third insulating layer 115 sequentially stacked. The first redistribution pattern 120 may include a first conductive line pattern 121, a first conductive via pattern 123, and a first seed layer 125. The second redistribution pattern 130 may include a second conductive line pattern 131, a second conductive via pattern 133, and a second seed layer 135. The third redistribution pattern 140 may include a third conductive line pattern 141, a third conductive via pattern 143, and a third seed layer 145.

The first insulating layer 111 may include a first via opening VO1 exposing a portion of the lower electrode pad 150. The first seed layer 125 may be disposed on a portion of an upper surface of the first insulating layer 111, a side wall of the first via opening VO1, and a portion of an upper surface of the lower electrode pad 150 exposed through the first via opening VO1. A portion of the first seed layer 125 may be interposed between the first conductive line pattern 121 and the upper surface of the first insulating layer 111, another portion of the first seed layer 125 may be formed to surround a side wall of the first conductive via pattern 123, and the other portion of the first seed layer 125 may be interposed between the first conductive via pattern 123 and the lower electrode pad 150.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

The first conductive line pattern 121 and the first conductive via pattern 123 may be disposed on the first seed layer 125. The first conductive line pattern 121 and the first conductive via pattern 123 may be formed together through a plating process, and may be integrated with each other as a single body. The first conductive line pattern 121 may be disposed on a portion of the first seed layer 125 formed on the upper surface of the first insulating layer 111, and the first conductive line pattern 121 may also be disposed on the first conductive via pattern 123. The first conductive via pattern 123 may cover a portion of the first seed layer 125 in the first via opening VO1 and may fill the first via opening VO1. For example, the top of the first conductive via pattern 123 may have the same level (e.g., be at the same vertical level) as the upper surface of the first insulating layer 111. For example, the first conductive via pattern 123 and a portion of the first seed layer 125 may fill the first via opening VO1 from the bottom to the top of the first via opening VO1. The first conductive via pattern 123 may penetrate the first insulating layer 111 to connect the first conductive line pattern 121 to the lower electrode pad 150. For example, the first conductive via pattern 123 may electrically connect the first conductive line pattern 121 to the lower electrode pad 150.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "parallel," "uniform," "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

In example embodiments, the first conductive via pattern 123 may have a shape that gradually decreases in a direction from a first surface 118 to a second surface 119 of the redistribution insulating layer 110. For example, cross-sectional areas of the first conductive via pattern 123 parallel to the upper surface of the first insulating layer 111 may gradually decrease from the upper surface of the first insulating layer 111 to the lower surface of the first insulating layer 111. For example, the width of the first conductive via pattern 123 in a cross-sectional view may gradually decrease from the top to the bottom of the first conductive via pattern 123 as shown in FIGS. 1 and 2.

A second insulating layer 113 may be stacked on the first insulating layer 111, the second insulating layer 113 covering a portion of the first conductive line pattern 121 and having a second via opening VO2 exposing the remaining portion of the first conductive line pattern 121. For example, a portion of the first conductive line pattern 121 may be covered by the second insulating layer 113 and a portion of the first conductive line pattern 121 may be exposed through the second via opening VO2 formed in the second insulating layer 113.

The second seed layer 135 may be disposed on a portion of an upper surface of the second insulating layer 113, a side wall of the second via opening V02, and a portion of an upper surface of the first conductive line pattern 121 exposed through the second via opening V02. A portion of the second seed layer 135 may be interposed between the second conductive line pattern 131 and the upper surface of the second insulating layer 113, another portion of the second seed layer 135 may be formed to surround a side wall of the second conductive via pattern 133, and the other portion of the second seed layer 135 may be interposed between the second conductive via pattern 133 and the first conductive line pattern 121.

The second conductive via pattern 133 and the second conductive line pattern 131 may be disposed on the second seed layer 135. The second conductive via pattern 133 and the second conductive line pattern 131 may be formed through a plating process, and may be integrated with each other as a single body. The second conductive line pattern 131 may be disposed on a portion of the second seed layer 135 on the upper surface of the second insulating layer 113, and the second conductive line pattern 131 may also be disposed on the second conductive via pattern 133. The second conductive via pattern 133 may cover a portion of the second seed layer 135 in the second via opening VO2 and may fill the second via opening V02. For example, the top of the second conductive via pattern 133 may have the same level (e.g., be at the same vertical level) as the upper surface of the second insulating layer 113. For example, the second conductive via pattern 133 and a portion of the second seed layer 135 may fill the second via opening VO2 from the bottom to the top of the second via opening VO1. The second conductive via pattern 133 may penetrate the second insulating layer 113 to connect the second conductive line pattern 131 to the first conductive line pattern 121. For example, the second conductive via pattern 133 may electrically connect the second conductive line pattern 131 to the first conductive line pattern 121.

In example embodiments, the second conductive via pattern 133 may have a shape that gradually decreases in the direction from the first surface 118 to the second surface 119 of the redistribution insulating layer 110. For example, cross-sectional areas of the second conductive via pattern 133 parallel to the upper surface of the second insulating layer 113 may gradually decrease from the upper surface of the second insulating layer 113 to the lower surface of the second insulating layer 113. For example, the width of the second conductive via pattern 133 in a cross-sectional view may gradually decrease from the top to the bottom of the second conductive via pattern 133 as shown in FIGS. 1 and 2.

A third insulating layer 115 may be stacked on the second insulating layer 113, the third insulating layer 115 covering a portion of the second conductive line pattern 131 and having a third via opening VO3 exposing the remaining portion of the second conductive line pattern 131. For example, a portion of the second conductive line pattern 131 may be covered by the third insulating layer 115 and a portion of the second conductive line pattern 131 may be exposed through the third via opening VO3 formed in the third insulating layer 115.

The third seed layer 145 may be disposed on a portion of an upper surface of the third insulating layer 115, a side wall of the third via opening V03, and a portion of the upper surface of the second conductive line pattern 131 exposed through the third via opening V03. A portion of the third seed layer 145 may be interposed between the third conductive line pattern 141 and the upper surface of the third insulating layer 115, another portion of the third seed layer 145 may be formed to surround a side wall of the third conductive via pattern 143, and the other portion of the third seed layer 145 may be interposed between the third conductive via pattern 143 and the second conductive line pattern 131.

The third conductive via pattern 143 and the third conductive line pattern 141 may be disposed on the third seed layer 145. The third conductive via pattern 143 and the third conductive line pattern 141 may be formed through a plating process, and may be integrated with each other as a single body. The third conductive line pattern 141 may be disposed on a portion of the third seed layer 145 on the upper surface of the third insulating layer 115, and the third conductive line pattern 141 may also be disposed on the third conductive via pattern 143. The third conductive via pattern 143 may cover a portion of the third seed layer 145 in the third via opening VO3 and may fill the third via opening V03. For example, the top of the third conductive via pattern 143 may have the same level (e.g., be at the same vertical level) as the upper surface of the third insulating layer 115. For example, the third conductive via pattern 143 and a portion of the third seed layer 145 may fill the third via opening VO3 from the bottom to the top of the third via opening V03. The third conductive via pattern 143 may penetrate the third insulating layer 115 to connect the third conductive line pattern 141 to the second conductive line pattern 131. For example, the third conductive via pattern 143 may electrically connect the third conductive line pattern 141 to the second conductive line pattern 131.

In example embodiments, the third conductive via pattern 143 may have a shape that gradually decreases in the direction from the first surface 118 to the second surface 119 of the redistribution insulating layer 110. For example, cross-sectional areas of the third conductive via pattern 143 parallel to the upper surface of the third insulating layer 115 may gradually decrease from the upper surface of the third insulating layer 115 to the lower surface of the third insulating layer 115. For example, the width of the third conductive via pattern 143 in a cross-sectional view may gradually decrease from the top to the bottom of the third conductive via pattern 143 as shown in FIGS. 1 and 2.

In example embodiments, the third conductive line pattern 141 may be provided on the first surface 118 of the redistribution insulating layer 110 and may function as an upper electrode pad to which the semiconductor chip 200 may be attached.

In FIG. 1, the redistribution structure 100 is illustrated to include three insulating layers 111, 113, and 115, three conductive line patterns 121, 131, and 141, and three conductive via patterns 123, 133, and 143, but is not limited thereto. The number of insulating layers, the number of conductive line patterns, and the number of conductive via patterns may be variously modified according to the design of circuit interconnection in the redistribution structure 100.

The semiconductor chip 200 may be attached on the redistribution structure 100. For example, the semiconductor chip 200 may be mounted on the redistribution structure 100 in a flip chip manner. For example, the semiconductor chip 200 may be inverted to bring chip pads 220 down onto chip connection terminals 230 and/or down toward the third conductive line patterns 141.

The semiconductor chip 200 may include, for example, a central processing unit (CPU) chip, a graphic processing unit (GPU) chip, or an application processor (AP) chip. The semiconductor chip 200 may include, for example, a dynamic random access memory (DRAM) chip, a static random access memory (SRAM) chip, a flash memory chip, an electrically erasable and programmable read-only memory (EPROM) chip, a phase-change random access memory (PRAM) chip, a magnetic random access memory (MRAM) chip, or a resistive random access memory (RRAM) chip.

The semiconductor chip 200 may include a semiconductor substrate 210 and a chip pad 220 disposed on one surface of the semiconductor substrate 210.

The semiconductor substrate 210 may include, for example, silicon (Si). Alternatively, the semiconductor substrate 210 may include a semiconductor element such as germanium (Ge) or a compound semiconductor such as silicon carbide (SiC), gallium arsenide (GaAs), indium arsenide (InAs), and indium phosphide (InP). The semiconductor substrate 210 may have an active surface and an inactive surface opposite to the active surface. In example embodiments, the active surface of the semiconductor substrate 210 may face the redistribution structure 100.

The semiconductor chip 200 may include a plurality of individual devices of various kinds on the active surface of the semiconductor substrate 210.

A chip connection terminal 230 may be disposed between the chip pad 220 of the semiconductor chip 200 and the third conductive line pattern 141 serving as an upper electrode pad of the redistribution structure 100. The chip connection terminal 230 may electrically connect the chip pad 220 of the semiconductor chip 200 and the third conductive line pattern 141. The chip connection terminal 230 may include, for example, at least one from among a pillar structure, a solder bump, a solder ball, and a solder layer.

Through a path of the chip connection terminal 230, the first to third redistribution patterns 120, 130, and 140 of the redistribution structure 100, the lower electrode pad 150, and the external connection terminal 400, the semiconductor chip 200 may receive from the outside at least one from among a control signal, a power supply signal, and a ground signal for operation of the semiconductor chip 200, and also may receive from the outside a data signal to be stored in the semiconductor chip 200 or may provide to the outside a data signal stored in the semiconductor chip 200.

An underfill material layer 240 surrounding the chip connection terminal 230 may be filled between the semiconductor chip 200 and the redistribution structure 100. The underfill material layer 240 may include, for example, an epoxy resin formed by a capillary under-fill method. In example embodiments, the underfill material layer 240 may include a non-conductive film (NCF), e.g., an insulator.

The lower electrode pad 150 may be provided on a lower side of the redistribution structure 100. The external connection terminal 400 may be disposed on the lower electrode pad 150. The semiconductor package 10 may be electrically connected to and mounted on a module substrate or a system board of an electronic product/device through the external connection terminal 400. The lower electrode pad 150 may function as an under bump metallurgy (UBM) in which the external connection terminal 400 is disposed.

For example, the lower electrode pad 150, and other pads described herein, may entirely have a uniform thickness. A bottom surface of the lower electrode pad 150 on which the external connection terminal 400 is disposed may include a flat surface. A top surface of the lower electrode pad 150 may also have a flat surface, which may be parallel to the bottom surface. For example, the lower electrode pad 150 may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof, but is not limited thereto.

In example embodiments, a portion of the lower electrode pad 150 may be embedded in the redistribution insulating layer 110, and another portion of the lower electrode pad 150 may protrude from the redistribution insulating layer 110. For example, the embedded portion of the lower electrode pad 150 may be a portion recessed into the redistribution insulating layer 110 with respect to a surface level of the redistribution insulating layer 110. For example, the redistribution insulating layer 110 may cover a portion of a sidewall of the lower electrode pad 150, but may not cover another portion of the sidewall of the lower electrode pad 150. In certain embodiments, one portion of the lower electrode pad 150 may be embedded in the redistribution insulating layer 110 and the other portion of the lower electrode pad 150 may protrude from the redistribution insulating layer 110 as shown in FIGS. 1 and 2. For example, the level of the top surface of the lower electrode pad 150 may be higher than the level of the second surface 119 of the redistribution insulating layer 110 as shown in FIGS. 1 and 2. For example, the top surface of the lower electrode pad 150 may contact the redistribution insulating layer 110.

According to example embodiments of the inventive concept, another portion of the lower electrode pad 150 may protrude from the second surface 119 of the redistribution insulating layer 110, and thus, stress along the second surface 119 of the redistribution insulating layer 110 may be reduced at the sidewall of the lower electrode pad 150. Accordingly, damages to the lower electrode pad 150 and the redistribution structure 100 around it due to the stress on the semiconductor package 10 may be prevented, and ultimately, the reliability of the semiconductor package 10 may be improved.

For example, the portion of the lower electrode pad 150 embedded in (or surrounded by) the redistribution insulating layer 110 may be defined as a first portion 151 of the lower electrode pad 150, and another portion of the lower electrode pad 150 protruding from the second surface 119 of the redistribution insulating layer 110 may be defined as a second portion 153 of the lower electrode pad 150. In this case, a sidewall of the first portion 151 of the lower electrode pad 150 may be covered by the redistribution insulating layer 110, and a sidewall of the second portion 153 of the lower electrode pad 150 may not be covered by the redistribution insulating layer 110. The sidewall of the second portion 153 of the lower electrode pad 150 may be exposed to the outside. For example, the second portion 153 of the electrode pad 150 may be exposed to the outside of the redistribution insulating layer 110. For example, the second portion 153 may be covered by another structure, e.g., by the external connection terminal 400 and/or another structure when the semiconductor package 10 is mounted on/connected to another device/structure.

In example embodiments, a thickness $151t$ of the first portion 151 of the lower electrode pad 150 may be greater than a thickness $153t$ of the second portion 153 of the lower electrode pad 150. For example, a height of the sidewall of the first portion 151 of the lower electrode pad 150 may be greater than a height of the sidewall of the second portion 153 of the lower electrode pad 150. When the thickness $153t$ of the second portion 153 of the lower electrode pad 150 protruding from the redistribution insulating layer 110 is too small, a stress relaxation effect at the sidewall of the lower electrode pad 150 may be degraded. When the thickness $153t$ of the second portion 153 of the lower electrode pad 150 protruding from the redistribution insulating layer 110 is too large, the thickness $151t$ of the first portion 151 of the lower electrode pad 150 embedded in the redistribution insulating layer 110 may be too small compared to a total thickness of the lower electrode pad 150, so that adhesiveness between the redistribution insulating layer 110 and the lower electrode pad 150 may be degraded.

In example embodiments, the thickness $153t$ of the second portion 153 of the lower electrode pad 150 may be between about 10% and about 30% of the total thickness of the lower electrode pad 150. For example, when the thickness of the lower electrode pad 150 is 10 µm, the thickness $153t$ of the second portion 153 of the lower electrode pad 150 protruding from the second surface 119 of the redistribution insulating layer 110 may be between about 1 µm and about 3 µm. For example, when the thickness of the lower electrode pad 150 is 10 µm, the thickness $151t$ of the first portion 151 of the lower electrode pad 150 embedded in the redistribution insulating layer 110 may be between about 7 µm and about 9 µm. The height direction of the sidewalls of the first and second portions 151 and 153 and the thickness direction of the lower electrode pad 150 including the first and second portions 151 and 153 may be perpendicular to the first surface 118 and/or to the second surface 119 of the redistribution insulating layer 110.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 10" may encompass a range such as a 0%-5% deviation around 0.1 and a 0% to 5% deviation around 10, especially if such deviation maintains the same effect as the listed range.

The semiconductor package 10 may further include a molding layer 300 covering at least a portion of the semiconductor chip 200 on the redistribution structure 100. The molding layer 300 may include, for example, an epoxy molding compound (EMC). The molding layer 300 may cover a portion of the first surface 118 of the redistribution insulating layer 110 and may cover a side surface of the semiconductor chip 200. In this case, an upper surface of the semiconductor chip 200 may be exposed to the outside, e.g., to the outside of the molding layer 300 or to the outside of the semiconductor package 10. In other example embodiments, the molding layer 300 may further cover the upper surface of the semiconductor chip 200.

Although not shown in the drawings, a heat dissipation member may be attached to the upper surface of the semiconductor chip 200. The heat dissipation member may include, for example, a heat slug or a heat sink. In example embodiments, a thermal conductive interface material (TIM) may be disposed between the heat dissipation member and the upper surface of the semiconductor chip 200. The thermal conductive interface material may include, for example, a mineral oil, grease, gap filler putty, a phase change gel, a phase change material pad, particle filled epoxy.

A footprint of the semiconductor chip 200 may be less than a footprint of the redistribution structure 100. For example, the area of the semiconductor chip 200 may be less than the area of the redistribution structure 100 in a plan view. For example, a horizontal width of the semiconductor chip 200 may be less than a horizontal width of the redistribution structure 100. In example embodiments, a portion of the plurality of conductive line patterns 121, 131, and 141 may extend to further protrude in the horizontal direction from a side surface of the semiconductor chip 200. For example, a portion of the first conductive line pattern 121 and a portion of the second conductive line pattern 131 may extend to further protrude in the horizontal direction from the side surface of the semiconductor chip 200. For example, a portion of the first conductive line pattern 121 and/or a portion of the second conductive line pattern 131 may protrude from side surface of the semiconductor chip 200 in a plan view. In certain embodiments, at least one of the plurality of lower electrode pads 150 may be disposed at a position spaced apart, e.g., outwards, from the side surface of the semiconductor chip 200, e.g., in a plan view.

Figure 3:
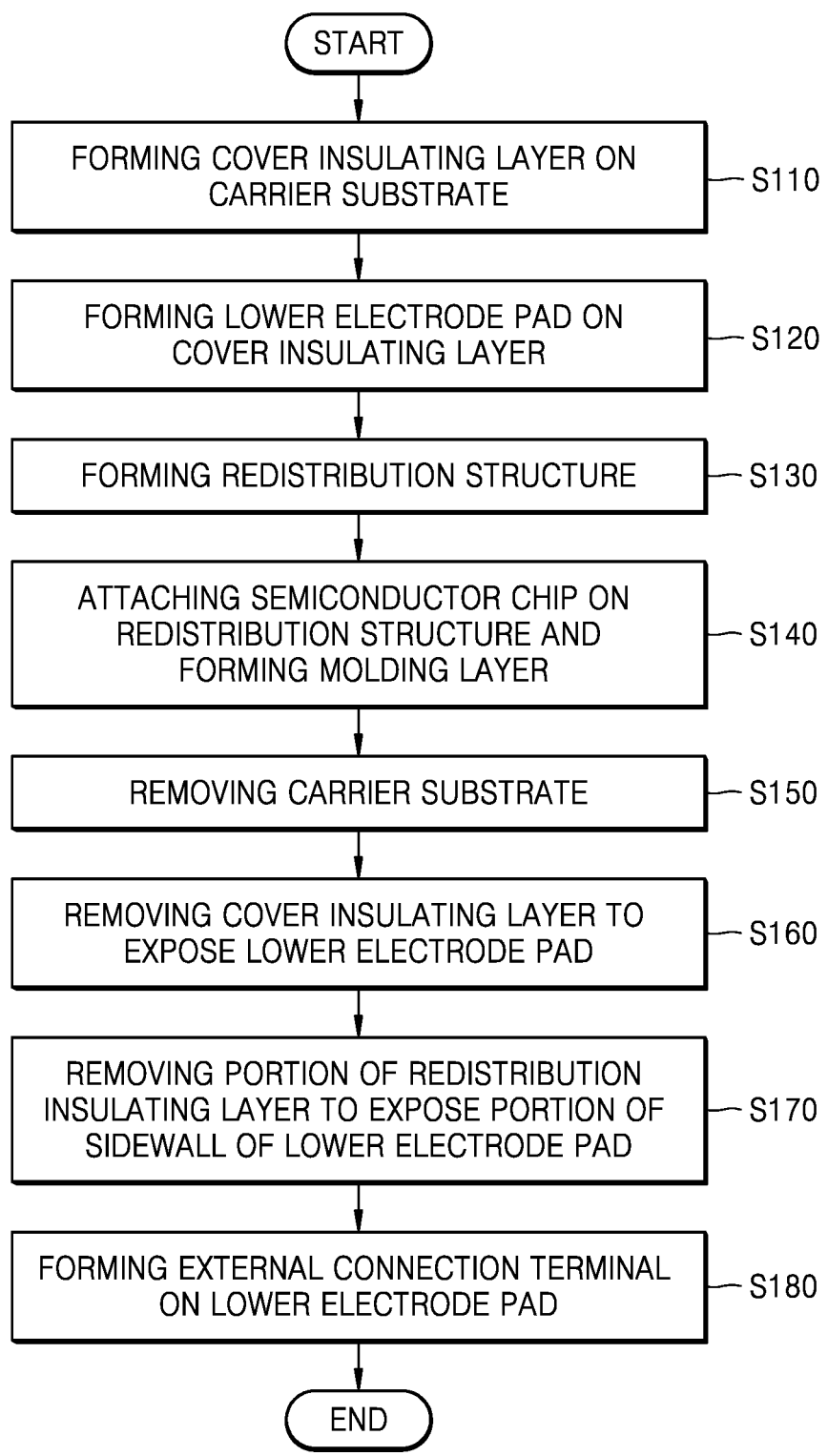
FIG. 3 is a flowchart illustrating a method of manufacturing a semiconductor package according to an example embodiment of the inventive concept.

FIG. 3 is a flowchart illustrating a method of manufacturing a semiconductor package according to an example embodiment of the inventive concept.

Referring to FIG. 3, the method of manufacturing the semiconductor package may include a first step S110 of forming a cover insulating layer on a carrier substrate, a second step S120 of forming a lower electrode pad on the cover insulating layer, a third step S130 of forming a redistribution structure, a fourth step S140 of attaching a semiconductor chip on the redistribution structure and forming a molding layer, a fifth step S150 of removing the carrier substrate, a sixth step S160 of removing the cover insulating layer to expose the lower electrode pad, a seventh step S170 of removing a portion of the redistribution insulating layer to expose a portion of a sidewall of the lower electrode pad, and an eighth step S180 of forming an external connection terminal on the lower electrode pad.

The method of manufacturing the semiconductor package may include the above process steps S110 to S180. In other embodiments, certain process steps may be performed in a different order from the above order. For example, two steps of processes described in succession may be performed substantially simultaneously or in a reverse order. Technical features of each of the first to eighth steps S110 to S180 will be described in more detail with reference to FIGS. 4A to 4L later.

FIGS. 4A to 4L are cross-sectional views sequentially illustrating a method of manufacturing the semiconductor package 10 according to example embodiments of the inventive concept.

Figure 4A:
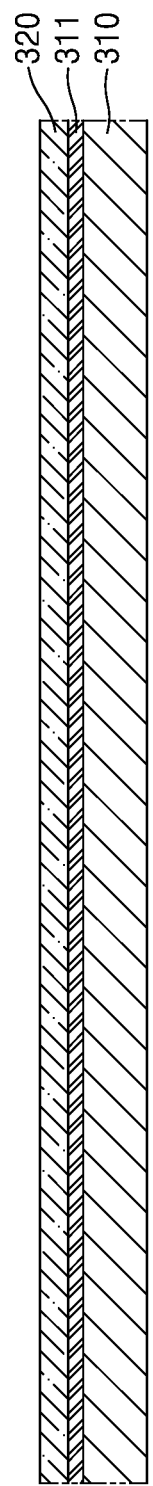
FIGS. 4A to 4L are cross-sectional views sequentially illustrating a method of manufacturing a semiconductor package according to example embodiments of the inventive concept.

Referring to FIG. 4A, a cover insulating layer 320 may be formed on a carrier substrate 310 to which a release film 311 is attached. The cover insulating layer 320 may include the same insulating material as that of the redistribution insulating layer 110 of FIG. 1, or may include an insulating material different from the redistribution insulating layer 110. For example, the cover insulating layer 320 may include a material film including an organic compound. In example embodiments, the cover insulating layer 320 may include photosensitive polyimide. Alternatively, for example, the cover insulating layer 320 may include oxide or nitride.

The carrier substrate 310 may support the cover insulating layer 320, and may include any material having process stability in a baking process and an etching process. For example, the carrier substrate 310 may be removed by heat and/or laser in a later process. When the carrier substrate 310 is separated and removed later by laser ablation, the carrier substrate 310 may include a transparent substrate. When the carrier substrate 310 is separated and removed later by heating, the carrier substrate 310 may be a heat resistant substrate. In example embodiments, the carrier substrate 310 may include a glass substrate. Alternatively, in other example embodiments, the carrier substrate 310 may include a heat resistant organic polymer material such as polyimide (PI), polyetheretherketone (PEEK), polyethersulfone (PES), polyphenylene sulfide (PPS), and the like, but is not limited thereto.

The release film 311 may include, for example, a laser reaction layer capable of allowing the carrier substrate 310 to be detachable by vaporizing in response to laser irradiation. The release film 311 may include a carbon-based material layer. For example, the release film 311 may include an amorphous carbon layer (ACL). For example, the release film 311 may include a spin-on hardmask (SOH) including a hydrocarbon compound having a relatively high carbon content of about 85% to about 99% by weight based on the total weight, or derivative thereof.

Figure 4B:
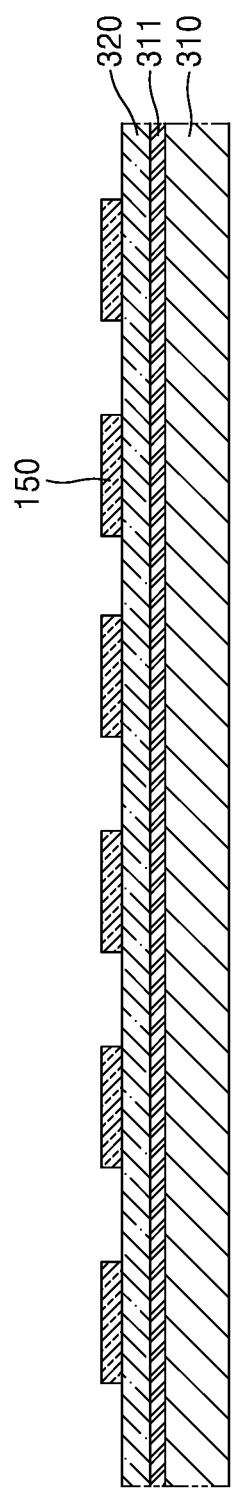

Referring to FIG. 4B, the lower electrode pad 150 may be formed on the cover insulating layer 320. In order to form the lower electrode pad 150, a conductive material film may be formed on the cover insulating layer 320, and then the conductive material film may be patterned. The lower electrode pad 150 may be formed to have a uniform thickness entirely on an upper surface of the cover insulating layer 320, and a lower surface of the lower electrode pad 150 in contact with the upper surface of the cover insulating layer 320 may have a flat shape.

In example embodiments, the lower electrode pad 150 may include a single metal material. Alternatively, the lower electrode pad 150 may have a multilayer structure in which each layer includes a different metal material from those of the other layers.

Figure 4C:
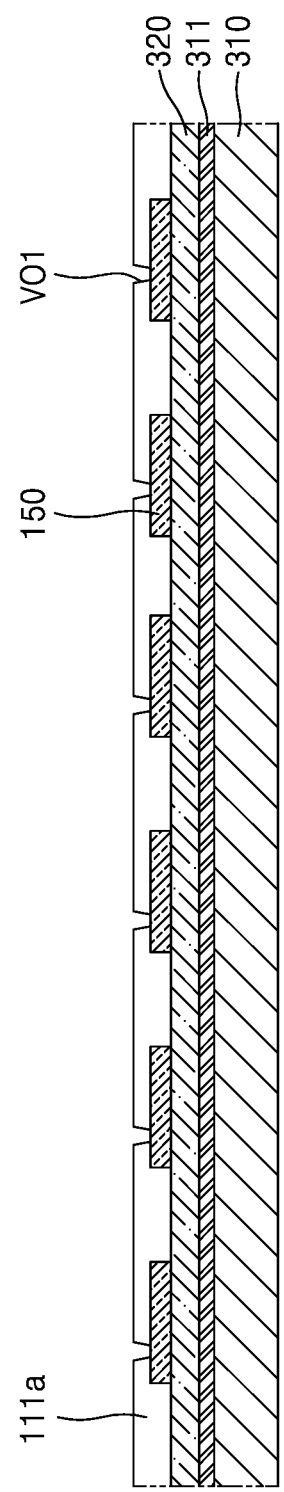

Referring to FIG. 4C, after forming the lower electrode pad 150, a first insulating layer 111a including the first via opening VO1 may be formed, in which the first via opening VO1 exposes a portion of the lower electrode pad 150. For example, in order to form the first insulating layer 111a, an insulating material film covering the lower electrode pad 150 and the cover insulating layer 320 may be formed, and then the first via opening VO1 may be formed by removing a portion of the insulating material film through an exposure and development process. A portion of the lower electrode pad 150 may be exposed by the first via opening VO1.

Figure 4D:
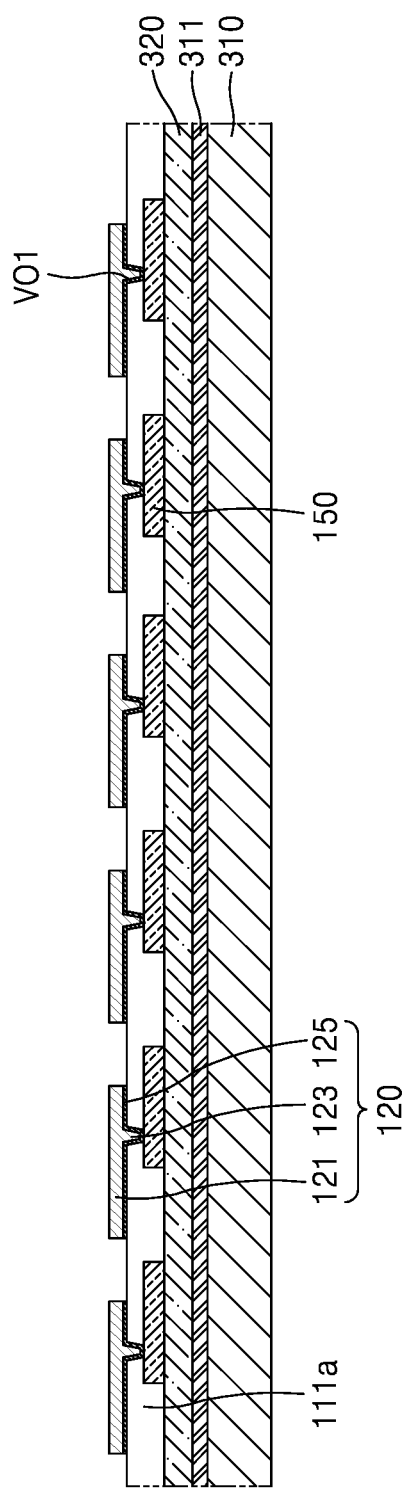

Referring to FIG. 4D, the first seed layer 125, the first conductive line pattern 121, and the first conductive via pattern 123 may be formed on a resultant structure of FIG. 4C. For example, the first seed layer 125 may be formed to cover an upper surface of the first insulating layer 111*a*, an inner side wall of the first insulating layer 111*a* provided by the first via opening VO1 (e.g., a side wall of the first via opening VO1), and the lower electrode pad 150 exposed through the first via opening VO1. The inner side wall of the first insulating layer 111*a* may be a surface of the first insulating layer 111*a* formed by the first via opening VO1, e.g., an inner side surface. The first conductive line pattern 121 may extend along the upper surface of the first insulating layer 111*a*, and the first conductive via pattern 123 may fill the first via opening VO1, e.g., along with a portion of the first seed layer 125. The first seed layer 125, the first conductive line pattern 121, and the first conductive via pattern 123 may constitute the first redistribution pattern 120. A method of forming the first redistribution pattern 120 will be described later in more detail with reference to FIGS. 5A to 5E.

Figure 4E:
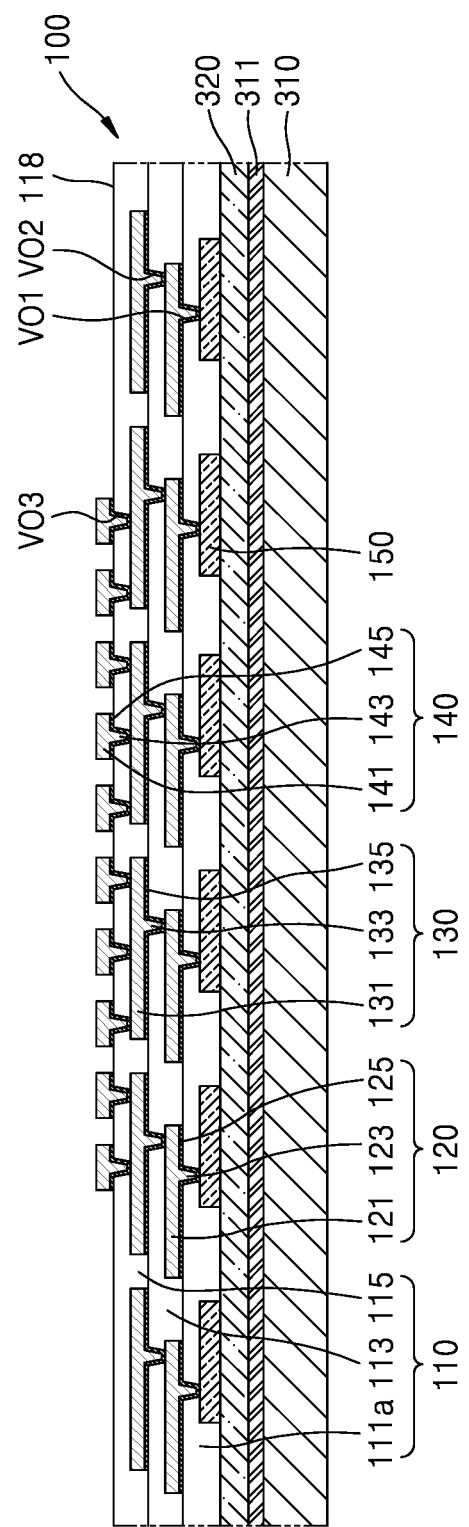

Referring to FIG. 4E, on a resultant structure of FIG. 4D, through substantially the same processes as or similar processes to that described with reference to FIGS. 4C and 4D, the second insulating layer 113 including the second via opening V02, the second redistribution pattern 130, the third insulating layer 115 including the third via opening V03, and the third redistribution pattern 140 may be sequentially formed. The first to third insulating layers 111, 113, and 115 and the first to third redistribution patterns 120, 130, and 140 may constitute the redistribution structure 100.

For example, the second seed layer 135 may be formed to cover an upper surface of the second insulating layer 113, an inner side wall of the second insulating layer 113 provided by the second via opening VO2 (e.g., a side wall of the second via opening V02), and a portion of the first conductive line pattern 121 exposed through the second via opening V02. The second conductive line pattern 131 may extend along the upper surface of the second insulating layer 113, and the second conductive via pattern 133 may fill the second via opening V02, e.g., along with a portion of the second seed layer 135. The second seed layer 135, the second conductive line pattern 131, and the second conductive via pattern 133 may constitute the second redistribution pattern 130.

The third seed layer 145 may be formed to cover an upper surface of the third insulating layer 115, an inner side wall of the third insulating layer 115 provided by the third via opening VO3 (e.g., a side wall of the third via opening V03), and a portion of the second conductive line pattern 131 exposed through the third via opening V03. The third conductive line pattern 141 may extend along the upper surface of the third insulating layer 115, and the third conductive via pattern 143 may fill the third via opening V03, e.g., along with a portion of the third seed layer 145. The third seed layer 145, the third conductive line pattern 141, and the third conductive via pattern 143 may constitute the third redistribution pattern 140.

Figure 4F:
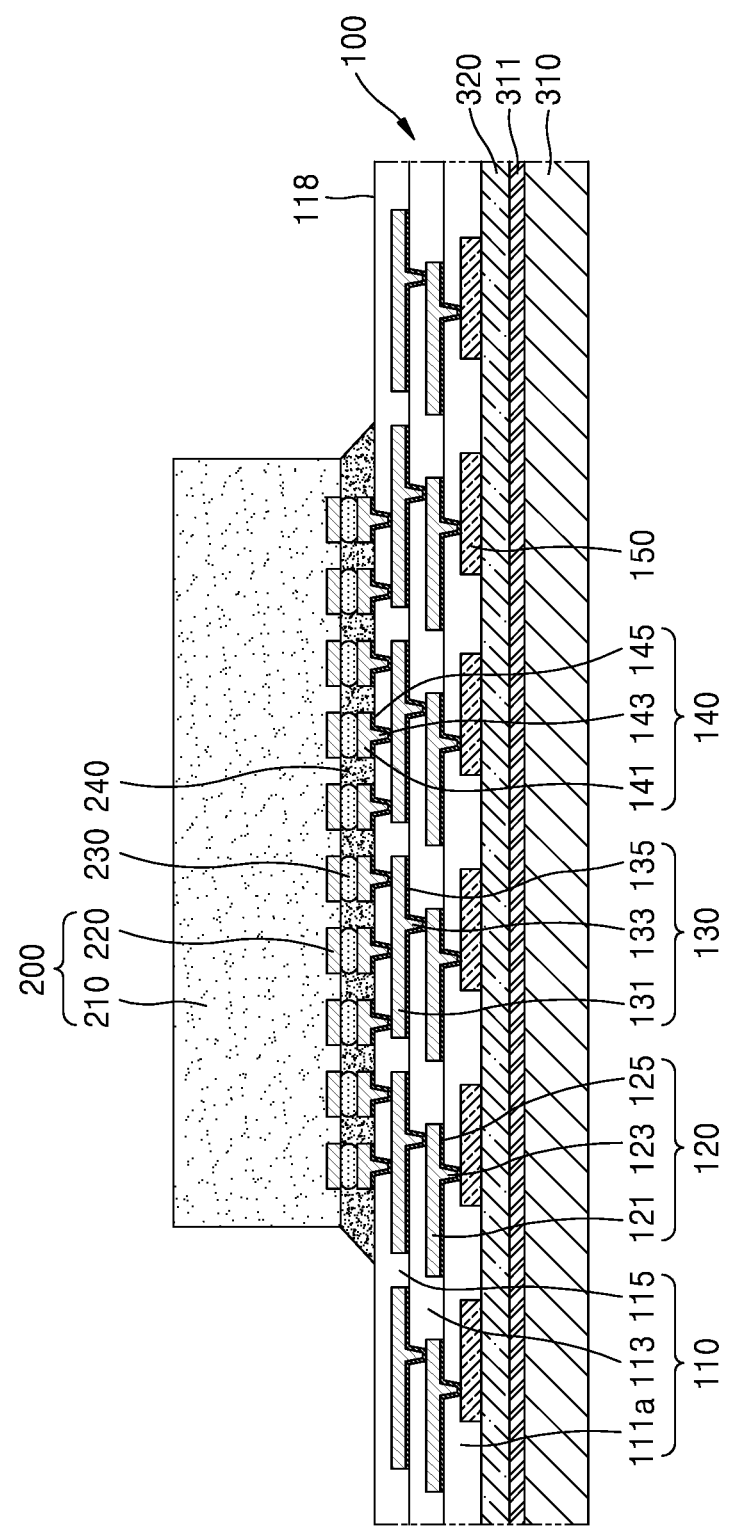

Referring to FIG. 4F, the semiconductor chip 200 may be attached to the redistribution structure 100. The semiconductor chip 200 may be attached on the redistribution structure 100 so that a chip pad 220 faces the redistribution structure 100. The chip pad 220 of the semiconductor chip 200 may be electrically connected to the third conductive line pattern 141 of the redistribution structure 100 through the chip connection terminal 230. In this case, the third conductive line pattern 141 may function as an upper electrode pad of the redistribution structure 100 in which the chip connection terminal 230 is seated.

After attaching the semiconductor chip 200 to the redistribution structure 100, the underfill material layer 240 may be formed to fill a space between the semiconductor chip 200 and the redistribution structure 100. The underfill material layer 240 may surround the chip connection terminal 230. For example, the underfill material layer 240 may be formed by a capillary underfill method after attaching the semiconductor chip 200 to the redistribution structure 100. In certain example embodiments, the underfill material layer 240 may be formed by attaching a nonconductive film on the chip pad 220 of the semiconductor chip 200, and then attaching the semiconductor chip 200 on the redistribution structure 100.

Figure 4G:
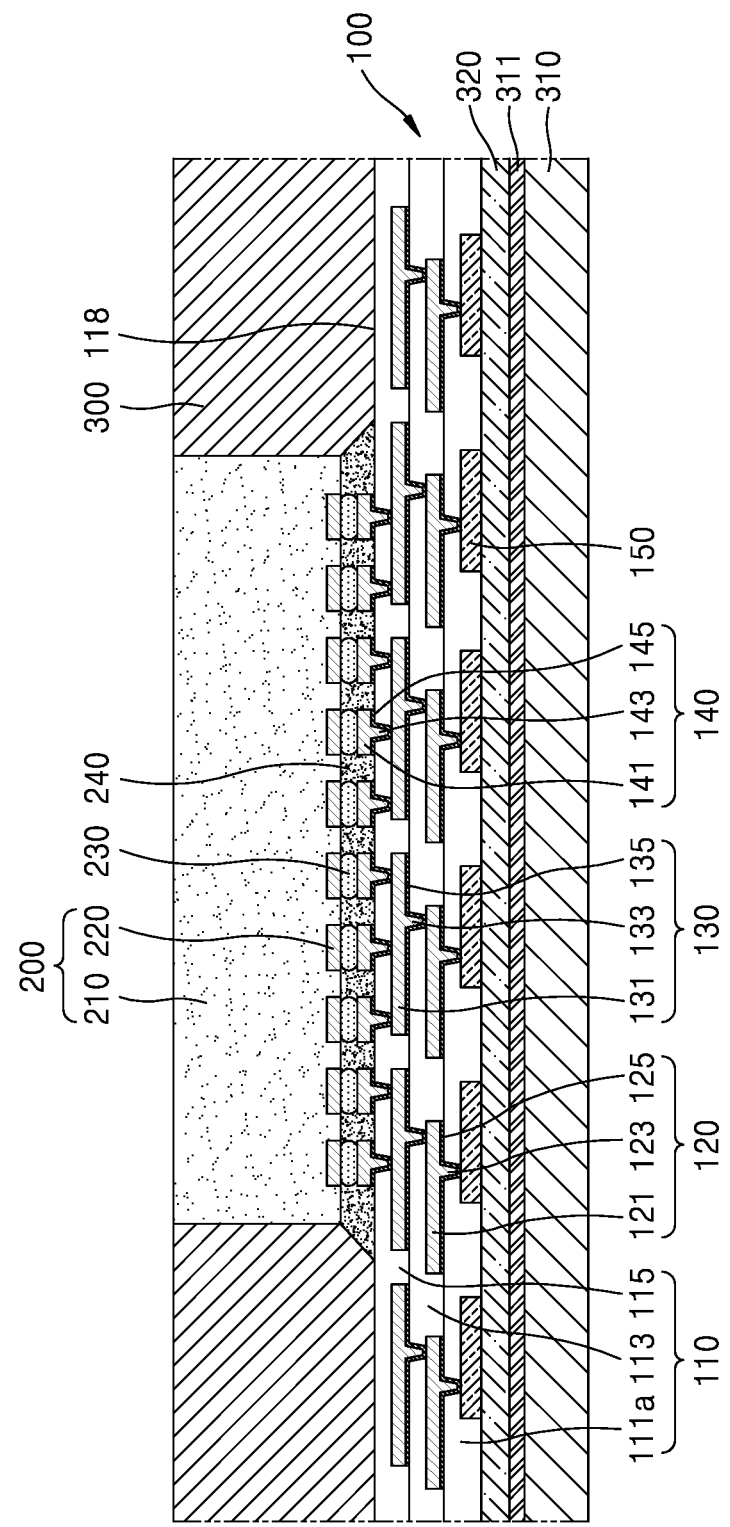

Referring to FIG. 4G, after forming the underfill material layer 240, a molding layer 300 for molding the semiconductor chip 200 may be formed. The molding layer 300 may cover side surfaces of the semiconductor chip 200 and expose an upper surface of the semiconductor chip 200. The molding layer 300 may cover a portion of the first surface 118 of the redistribution insulating layer 110. In other example embodiments, the molding layer 300 may be formed to further cover the upper surface of the semiconductor chip 200.

Figure 4H:
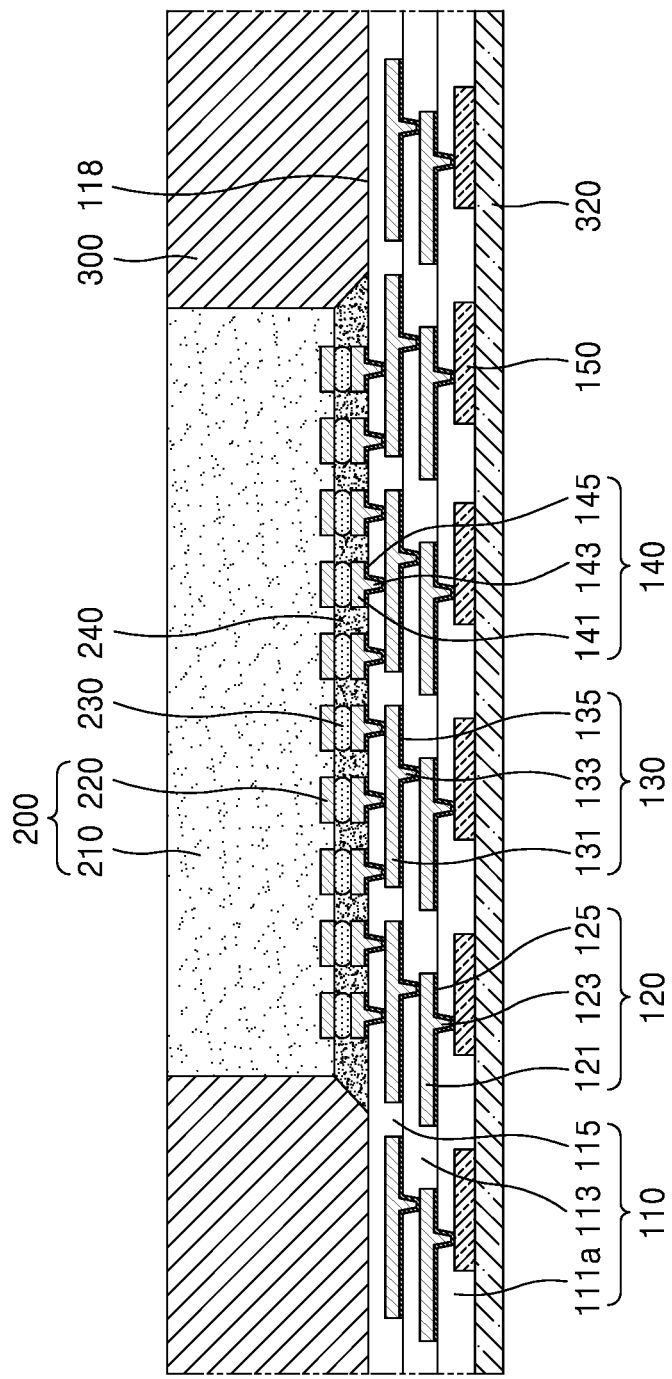

Referring to FIG. 4H together with FIG. 4G, after forming the molding layer 300, the carrier substrate 310 may be removed. For example, the carrier substrate 310 to which the release film 311 is attached may be separated from the other structure in a resultant structure of FIG. 4G. For example, in order to separate the carrier substrate 310, the release film 311 may be irradiated with laser or heated. As a result of the separation of the carrier substrate 310, the cover insulating layer 320 may be exposed.

Figure 4I:
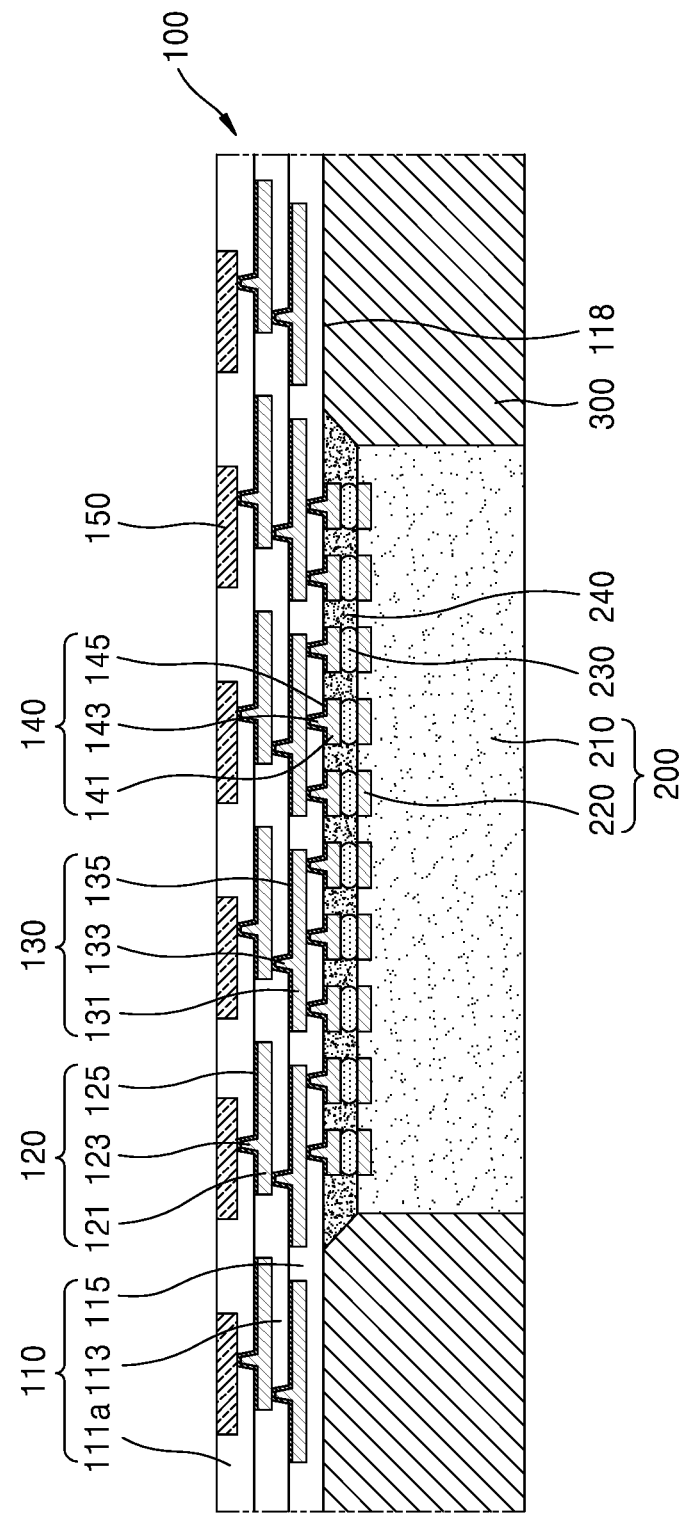

Referring to FIG. 4I, after inverting a resultant product of FIG. 4H, the cover insulating layer 320 may be removed to expose the lower electrode pad 150. For example, an etching process may be performed to remove the cover insulating layer 320. As the cover insulating layer 320 is removed, a lower surface of the lower electrode pad 150 may be exposed.

Figure 4J:
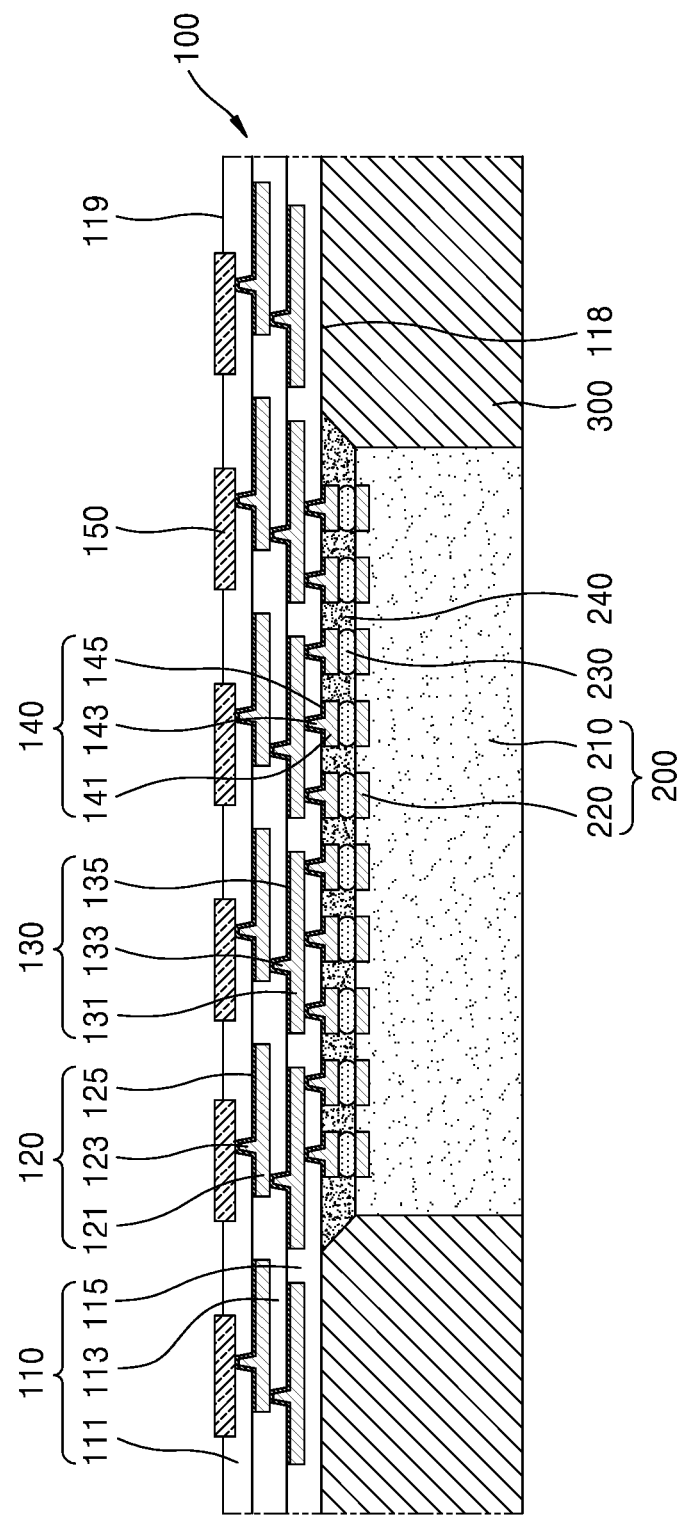

Referring to FIG. 4J and FIG. 4I, after removing the cover insulating layer 320, a portion of the first insulating layer 111*a* of FIG. 4I may be removed to expose a portion of the sidewall of the lower electrode pad 150. For example, a dry etching process may be performed to remove the portion of the first insulating layer 111*a* of FIG. 4I. As a result of removing the portion of the first insulating layer 111*a* of FIG. 4I, the first portion 151 of FIG. 2 may be embedded in the first insulating layer 111, and the second portion 153 of FIG. 2 of the lower electrode pad 150 may protrude from the first insulating layer 111.

In this case, by controlling an etching speed and etching time, a thickness of the lower electrode pad 150 protruding from the first insulating layer 111 may be adjusted. In example embodiments, as a result of the etching process on the first insulating layer 111, the thickness of the second portion 153 of the lower electrode pad 150 protruding from the first insulating layer 111 may be less than the thickness of the first portion 151 of the lower electrode pad 150 embedded in the first insulating layer 111.

In example embodiments, the portion of the first insulating layer 111*a* of FIG. 4I and the cover insulating layer 320 may be removed in the same etching process. For example, the portion of the first insulating layer 111*a* of FIG. 4I and the cover insulating layer 320 may be removed by performing one etching process. In this case, the cover insulating layer 320 may include the same material as the first insulating layer 111a of FIG. 4I.

Alternatively, in other example embodiments, the portion of the first insulating layer 111a of FIG. 4I and the cover insulating layer 320 may be removed through a separate etching process.

Figure 4K:
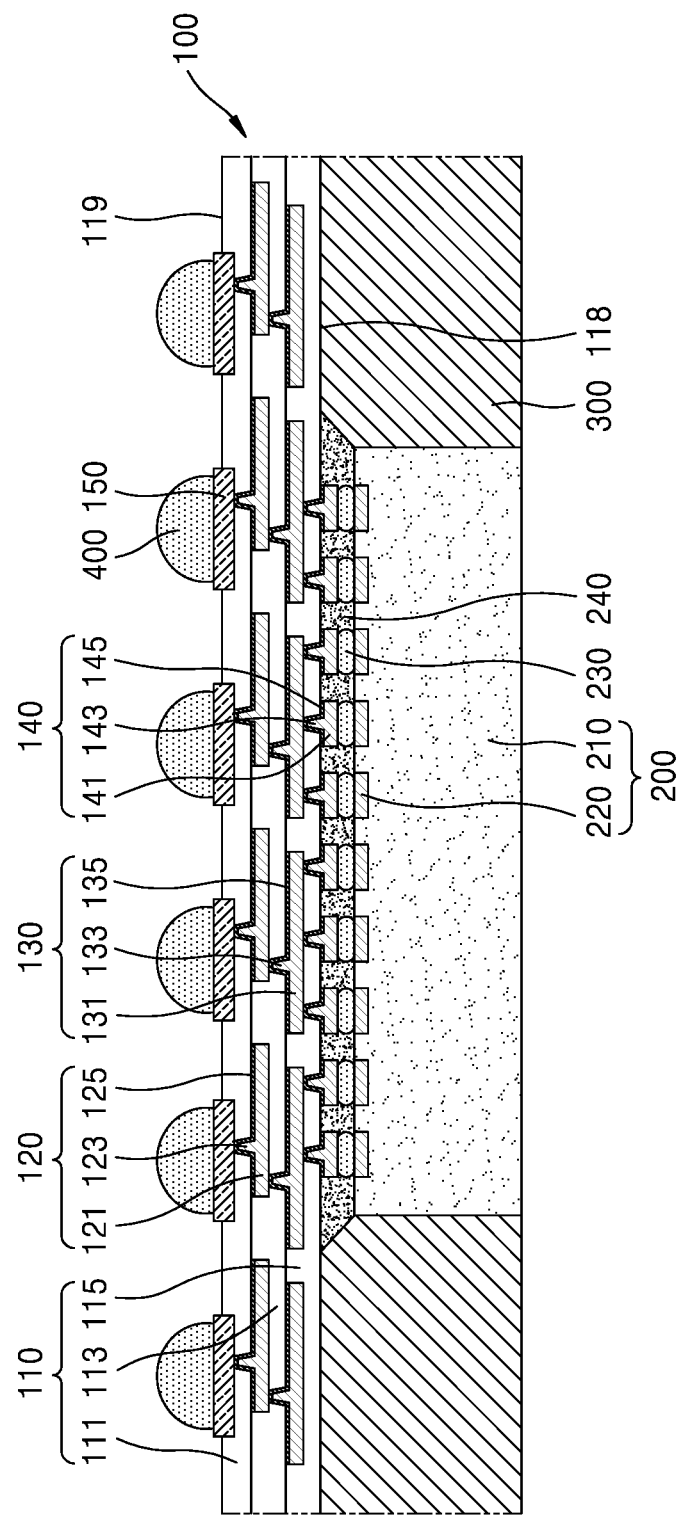

Referring to FIG. 4K, the external connection terminal 400 may be attached on the lower electrode pad 150. The external connection terminal 400 may include, for example, a solder ball or a bump.

Figure 4L:
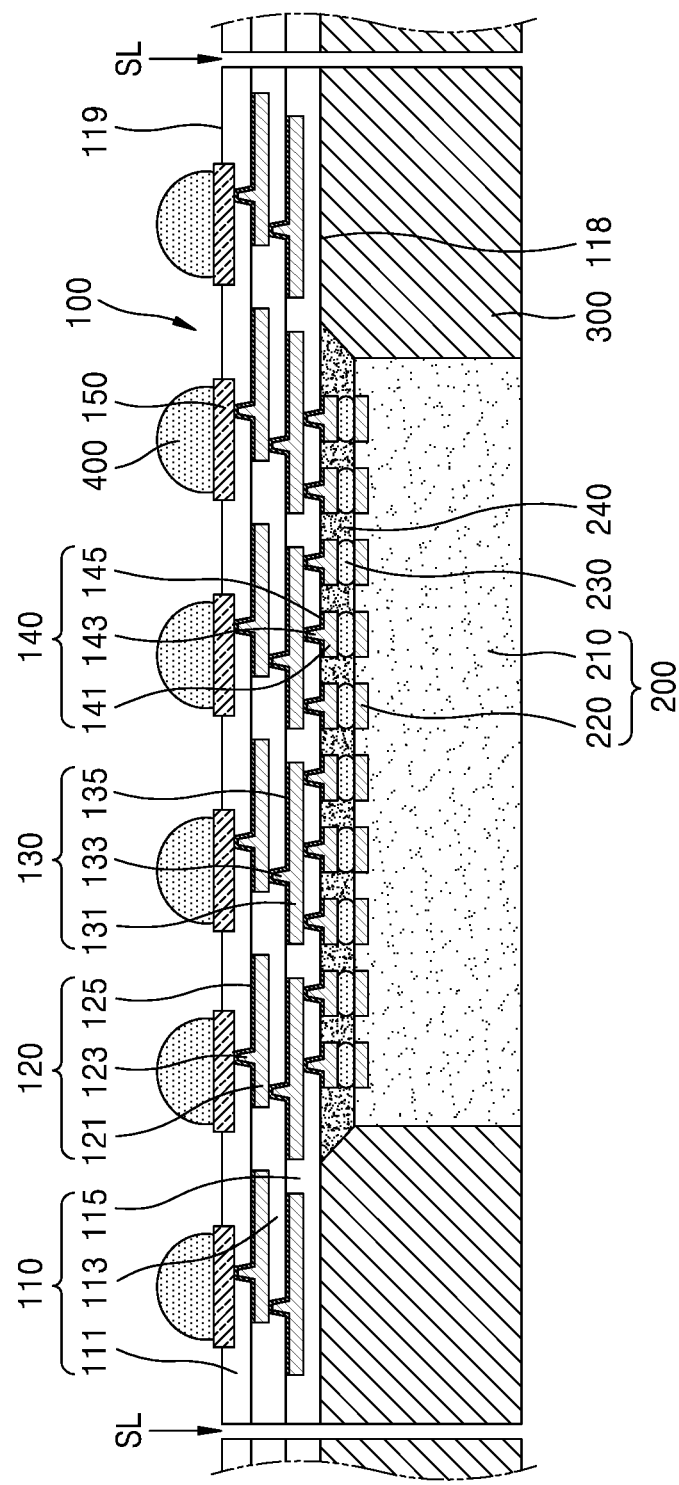

Referring to FIG. 4L, after the external connection terminal 400 is formed, the singulated semiconductor package 10 as illustrated in FIG. 1 may be completed through a singulation process of cutting the resultant product of FIG. 4K along a scribe lane SL.

In general, in a method of manufacturing a semiconductor package in a chip last manner, redistribution structure formation, chip attachment, UBM formation, and solder ball attachment may be performed in order. However, according to the method of manufacturing the semiconductor package according to example embodiments of the inventive concept, since the lower electrode pad 150 functioning as the UBM may be first formed before formation of the redistribution structure 100, the process may be simplified and the production cost may be reduced.

FIGS. 5A to 5E are cross-sectional views sequentially illustrating a method of forming the first redistribution pattern 120 according to example embodiments of the inventive concept.

Figure 5A:
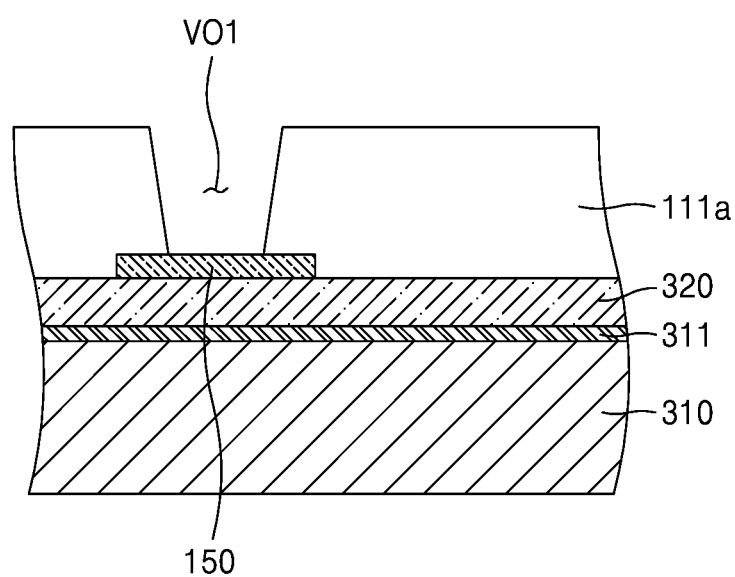
FIGS. 5A to 5E are cross-sectional views sequentially illustrating a method of forming a first redistribution pattern according to example embodiments of the inventive concept.

Referring to FIG. 5A, an insulating material layer may be formed on the cover insulating layer 320 and an etching process may be performed to the insulating material layer to form the first insulating layer 111a including the first via opening VO1. For example, in order to form the first via opening VO1, a reactive ion etching (RIE) process using plasma, laser drilling, or the like may be performed.

In example embodiments, the first via opening VO1 may have a shape in which a width of the first via opening VO1 is gradually narrowed downwards (or closer to the lower electrode pad 150), e.g., in a cross-sectional view as shown in FIG. 5A. An inner side wall of the first insulating layer 111a provided by the first via opening VO1 (e.g., the side wall of the first via opening VO1) may have an inclined sidewall portion. For example, an angle formed by the inclined sidewall portion and the lower surface of the first insulating layer 111a may be adjusted by controlling a combination of etching gases, gas supply amount, and etching rate and the like in an etching process. For example, the angle formed by the inclined sidewall portion and the lower surface of the first insulating layer 111a may be between about 75 degrees and about 85 degrees, e.g., in a cross-sectional view similar to the one in FIG. 5A.

Figure 5B:
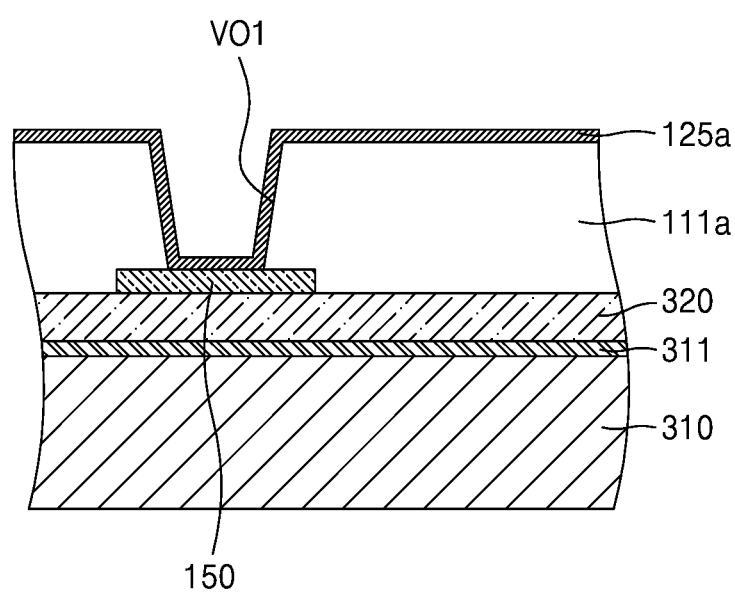

Referring to FIG. 5B, a first preliminary seed layer 125a may be formed to cover the upper surface of the first insulating layer 111a, the inner sidewall of the first insulating layer 111a provided by the first via opening VO1 (e.g., the side wall of the first via opening VO1), and the portion of the lower electrode pad 150 exposed through the first via opening VO1. The first preliminary seed layer 125a may conformally extend on the upper surface of the first insulating layer 111a, the inner sidewall of the first insulating layer 111a provided by the first via opening VO1, and the portion of the lower electrode pad 150 exposed through the first via opening VO1.

Figure 5C:
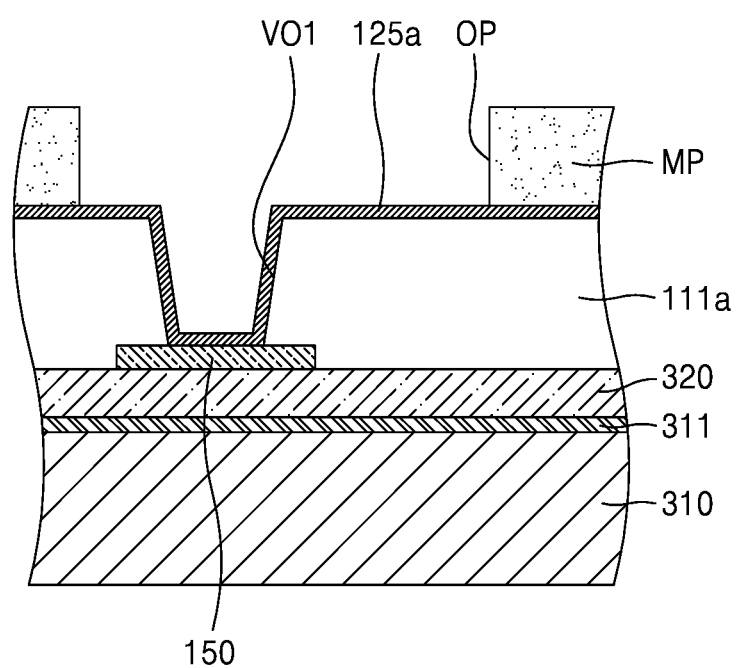

Referring to FIG. 5C, a mask pattern MP including an opening OP may be formed on the first preliminary seed layer 125a. The opening OP of the mask pattern MP may expose a portion of the first preliminary seed layer 125a, and define a region where the first conductive line pattern 121 and the first conductive via pattern 123 are formed in a subsequent process.

Figure 5D:
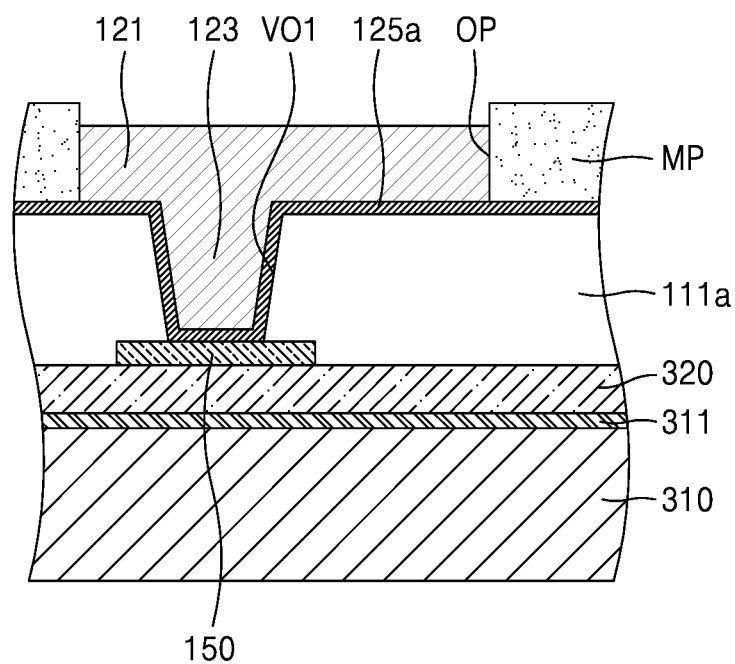

Referring to FIG. 5D, the first conductive line pattern 121 and the first conductive via pattern 123 may be formed on a portion of the first preliminary seed layer 125a exposed by the opening OP of the mask pattern MP. The first conductive line pattern 121 may extend over the upper surface of the first insulating layer 111a, and the first conductive via pattern 123 may fill the first via opening VO1, e.g., along with a portion of the first preliminary seed layer 125a. For example, the first conductive line pattern 121 and the first conductive via pattern 123 may be formed together through a plating process using the first preliminary seed layer 125a as a seed. The first conductive line pattern 121 and the first conductive via pattern 123 may be integrally formed as a single body.

In this case, since the first conductive via pattern 123 may be formed to fill the first via opening VO1 in the first insulating layer 111a, the first conductive via pattern 123 may have a shape corresponding to that of the first via opening VO1. For example, the first conductive via pattern 123 may be formed in the first via opening VO1 in which the first preliminary seed layer 125a is conformally formed. For example, the first conductive via pattern 123 may have a shape that gradually decreases in width downwards (or closer to the lower electrode pad 150), e.g., in a cross-sectional view as shown in FIG. 5D.

Figure 5E:
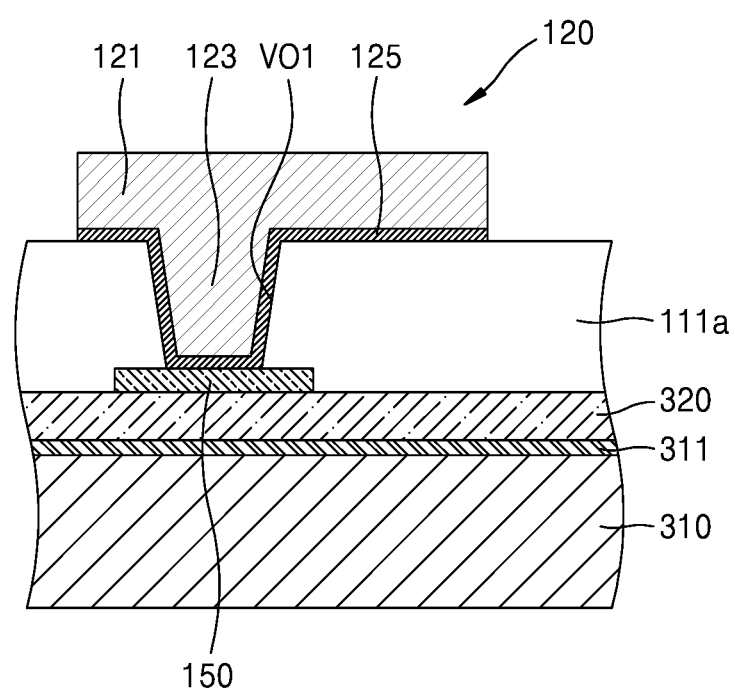

Referring to FIG. 5E and FIG. 5D, after forming the first conductive line pattern 121 and the first conductive via pattern 123, the mask pattern MP may be removed and then a portion of the first preliminary seed layer 125a exposed by removing the mask pattern MP may be removed. As a result of the removal of the portion of the first preliminary seed layer 125a exposed by removing the mask pattern MP, the first seed layer 125 may be formed. The first seed layer 125 may be interposed between the first conductive line pattern 121 and the first insulating layer 111a, between the first conductive via pattern 123 and the inner side wall of the first insulating layer 111a, and between the conductive via pattern 123 and the lower electrode pad 150.

The same method as or a similar method to the method of forming the first redistribution pattern 120 illustrated with reference to FIGS. 5A to 5E may be used to form each of the second redistribution pattern 130 in FIG. 4E and the third redistribution pattern 140 in FIG. 4E.

Figure 6:
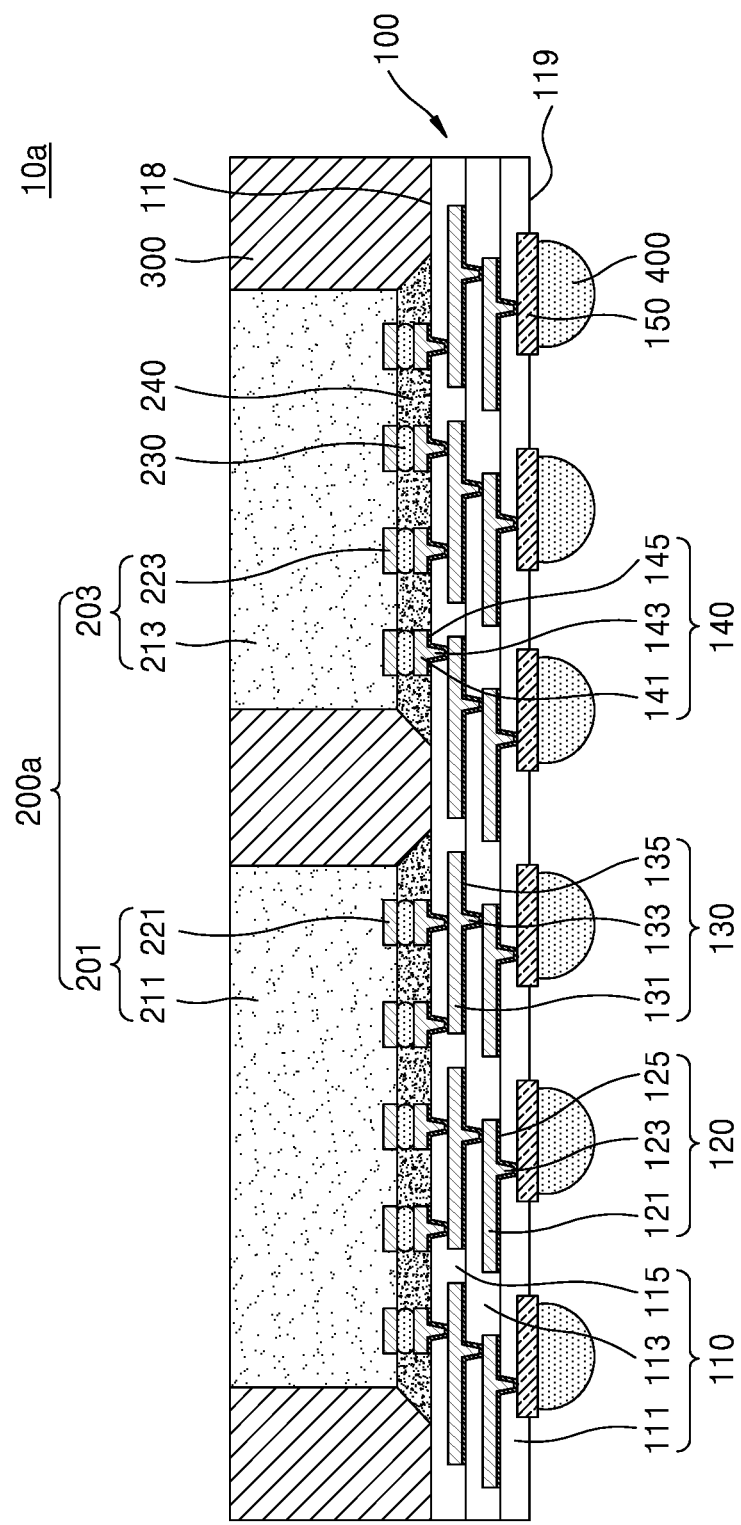
FIG. 6 is a cross-sectional view illustrating a semiconductor package according to an example embodiment of the inventive concept.

FIG. 6 is a cross-sectional view illustrating a semiconductor package 10a according to some embodiments of the inventive concept. The semiconductor package 10a illustrated in FIG. 6 may be substantially the same as or similar to the semiconductor package 10 described with reference to FIGS. 1 and 2 except that the semiconductor package 10a includes a plurality of semiconductor chips 200a.

Referring to FIG. 6, the semiconductor package 10a may include a redistribution structure 100 and the plurality of semiconductor chips 200a on the redistribution structure 100. The plurality of semiconductor chips 200a may include a first semiconductor chip 201 and a second semiconductor chip 203 spaced apart from each other. The first semiconductor chip 201 may include a semiconductor substrate 211 and a chip pad 221, and the chip pad 221 of the first semiconductor chip 201 may be electrically connected to a third redistribution pattern 140 through a chip connection terminal 230. The second semiconductor chip 203 may include a semiconductor substrate 213 and a chip pad 223, and the chip pad 223 of the second semiconductor chip 203 may be electrically connected to a third redistribution pattern 140 through a chip connection terminal 230.

In example embodiments, the first semiconductor chip 201 and the second semiconductor chip 203 may include different types of semiconductor chips. For example, when the first semiconductor chip 201 is a non-memory chip, the second semiconductor chip 203 may be a memory chip. For example, the first semiconductor chip 201 may include a logic chip. The first semiconductor chip 201 may include a central processing unit (CPU) chip, a graphic processing unit (GPU) chip, or an application processor (AP) chip. In some embodiment, the second semiconductor chip 203 may include, for example, a dynamic random access memory (DRAM) chip, a static random access memory (SRAM) chip, a flash memory chip, an electrically erasable and programmable read-only memory (EPROM) chip, a phase-change random access memory (PRAM) chip, a magnetic random access memory (MRAM) chip, or a resistive random access memory (RRAIVI) chip. In some embodiments, the second semiconductor chip 203 may include a high bandwidth memory (HBM) DRAM semiconductor chip. Alternatively, in other example embodiments, the first semiconductor chip 201 and the second semiconductor chip 203 may include the same type of semiconductor chips. In example embodiments, the semiconductor package 10a may include a system in package (SIP) where different kinds of semiconductor chips are electrically connected to each other to operate as one system.

In this case, a footprint occupied by the plurality of semiconductor chips 200a may be less than a horizontal area of the redistribution structure 100. The footprint occupied by the plurality of semiconductor chips 200a may entirely overlap the redistribution structure 100 in a vertical direction. For example, the area of the plurality of semiconductor chips 200a may be less than the area of the redistribution structure 100 in a plan view. In certain embodiments, the plurality of semiconductor chips 200a may be vertically stacked forming stacked chips.

FIG. 7 is a cross-sectional view illustrating a semiconductor package 10b according to an embodiment of the inventive concept.

Referring to FIG. 7, the semiconductor package 10b may include a lower package 11L and an upper package 11U on the lower package 11L. The semiconductor package 10b may include a semiconductor package in the form of a package on package (POP) in which the upper package 11U is attached to the lower package 11L.

The lower package 11L may include a first redistribution structure 100L including a redistribution insulating layer 110L and redistribution patterns 120L, 130L, and 140L, a first semiconductor chip 200L, a first lower electrode pad 150L, a first chip connection terminal 230L, a first underfill material layer 240L, a first molding layer 300L, and a first conductive pillar 160. The first redistribution structure 100L, the first semiconductor chip 200L, the first lower electrode pad 150L, the first chip connection terminal 230L, the first underfill material layer 240L, and the first molding layer 300L of the lower package 11L may be respectively substantially the same as or similar to the redistribution structure 100, the semiconductor chip 200, the lower electrode pad 150, the chip connection terminal 230, the underfill material layer 240, and the molding layer 300 of the semiconductor package 10 described above with reference to FIGS. 1 and 2.

The first conductive pillar 160 may penetrate the first molding layer 300L. A portion of a third conductive line pattern 140L of the first redistribution structure 100L may be connected to a lower end of the first molding layer 300L. An upper end of the first molding layer 300L may be connected to an inter-package connection terminal 410. A third conductive line pattern 140L of the first redistribution structure 100L may contact and/or be electrically connected to a lower end of the first conductive pillar 160. An upper end of the first conductive pillar 160 may contact and/or be electrically connected to the inter-package connection terminal 410.

The upper package 11U may include a second redistribution structure 100U including a second redistribution insulating layer 110U and second redistribution patterns 120U and 140U, a second semiconductor chip 200U, a second lower electrode pad 150U, a second chip connection terminal 230U, a second underfill material layer 240U, and a second molding layer 300U. The second redistribution structure 100U, the second semiconductor chip 200U, the second lower electrode pad 150U, the second chip connection terminal 230U, the second underfill material layer 240U, and the second molding layer 300U of the upper package 11U may be respectively substantially the same as or similar to the redistribution structure 100, the semiconductor chip 200, the lower electrode pad 150, the chip connection terminal 230, the underfill material layer 240, and the molding layer 300 of the semiconductor package 10 described above with reference to FIGS. 1 and 2.

The upper package 11U may be electrically and physically connected to the lower package 11L by the inter-package connection terminal 410 interposed between the upper package 11U and the lower package 11L. The inter-package connection terminal 410 may contact a bottom surface of the second lower electrode pad 150U of the upper package 11U and may contact the first conductive pillar 160 of the lower package 11L.

In example embodiments, a portion of the second lower electrode pad 150U of the upper package 11U may protrude from the second redistribution insulating layer 110U similarly to the lower electrode pad 150 described with reference to FIGS. 1 and 2. For example, a thickness of the portion of the second lower electrode pad 150U embedded in the second redistribution insulating layer 110U may be greater than a thickness of another portion of the second lower electrode pad 150U protruding from the second redistribution insulating layer 110U.

In example embodiments, the first semiconductor chip 200L and the second semiconductor chip 200U may include different types of semiconductor chips. Alternatively, in other example embodiments, the first semiconductor chip 200L and the second semiconductor chip 200U may include semiconductor chips of the same type.

The second semiconductor chip 200U may be electrically connected to the first semiconductor chip 200L and/or the outside via the plurality of conductive line patterns 121U and 141U and a plurality of conductive via patterns 123U and 143U included in the second redistribution structure 100U, the second lower electrode pad 150U, the inter-package connection terminal 410, the first conductive pillars 160, and the plurality of conductive line patterns 121L, 131L, and 141L and the plurality of conductive via patterns 123L, 133L, and 143L included in the first redistribution structure 100L.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor package, the method comprising:
   forming a lower electrode pad on a carrier substrate;
   forming a redistribution structure on the carrier substrate, the redistribution structure comprising a redistribution insulating layer and a conductive redistribution pattern that is electrically connected to the lower electrode pad;
   mounting a semiconductor chip on the redistribution structure;
   removing the carrier substrate; and
   removing part of the redistribution insulating layer such that the lower electrode pad has a first portion embedded in the redistribution insulating layer and a second portion protruding from a bottom surface of the redistribution insulating layer,
   wherein a thickness of the first portion of the lower electrode pad is greater than a thickness of the second portion of the lower electrode pad, and
   wherein the lower electrode pad has a rectangular cross-section.

2. The method of claim 1, wherein the thickness of the second portion of the lower electrode pad is between about 10% and about 30% of a total thickness of the lower electrode pad.

3. The method of claim 1, wherein a sidewall of the second portion of the lower electrode pad is exposed to an outside of the redistribution insulating layer.

4. The method of claim 1, wherein the forming of the redistribution structure comprises:
   forming a first redistribution insulating layer on the carrier substrate, the first redistribution insulating layer being in contact with a side wall and a top surface of the lower electrode pad; and
   forming a first conductive redistribution pattern that is electrically connected to the lower electrode pad,
   wherein the first conductive redistribution pattern comprises:
   a first conductive line pattern extending from a top surface of the first redistribution insulating layer; and
   a first conductive via pattern provided in a via opening of the first redistribution insulating layer and extending between the first conductive line pattern and the top surface of the lower electrode pad.

5. The method of claim 4, wherein the forming of the first conductive redistribution pattern comprises forming a seed layer that is in contact with the top surface of the first redistribution insulating layer and the top surface of the lower electrode pad.

6. The method of claim 4, wherein a width of the first conductive via pattern gradually decreases toward the top surface of the lower electrode pad.

7. The method of claim 1, further comprising forming an external connection terminal on a bottom surface of the second portion of the lower electrode pad,
   wherein the bottom surface of the second portion of the lower electrode pad is flat.

8. The method of claim 1, wherein the semiconductor chip is attached by a chip connection terminal on the redistribution structure,
   the method further comprising forming an underfill material that is provided between the semiconductor chip and the redistribution structure and encompasses the chip connection terminal.

9. The method of claim 1, further comprising forming a molding layer that covers a side surface of the semiconductor chip.

10. A method of manufacturing a semiconductor package, the method comprising:
    forming a lower electrode pad;
    forming a first redistribution insulating layer in contact with a top surface and a side wall of the lower electrode pad;
    forming a first conductive redistribution pattern electrically connected to the lower electrode pad, the first conductive redistribution pattern comprising a first conductive line pattern extending along a top surface of the first redistribution insulating layer and a first conductive via pattern extending between the first conductive line pattern and the top surface of the lower electrode pad;
    forming a second redistribution insulating layer on the first redistribution insulating layer, the second redistribution insulating layer covering the first conductive line pattern;
    forming a second conductive redistribution pattern electrically connected to the first conductive redistribution pattern, the second conductive redistribution pattern comprising a second conductive line pattern extending along a top surface of the second redistribution insulating layer and a second conductive via pattern extending between the second conductive line pattern and the first conductive line pattern;
    arranging a semiconductor chip on the second redistribution insulating layer, the semiconductor chip being electrically connected to the second conductive redistribution pattern; and
    removing part of the first redistribution insulating layer such that the lower electrode pad has a first portion embedded in the first redistribution insulating layer and a second portion protruding from a bottom surface of the first redistribution insulating layer,
    wherein a thickness of the first portion of the lower electrode pad is greater than a thickness of the second portion of the lower electrode pad, and
    wherein a width of the first conductive via pattern gradually decreases toward the top surface of the lower electrode pad.

11. The method of claim 10, wherein a width of the second conductive via pattern gradually decreases toward the first conductive line pattern.

12. The method of claim 10, wherein a thickness of the second portion of the lower electrode pad is between about 1 μm to about 3 μm.

13. The method of claim 10, wherein the lower electrode pad has a rectangular cross-section.

14. The method of claim 13, wherein a height of a side wall of the first portion of the lower electrode pad is greater than a height of a sidewall of the second portion of the lower electrode pad.

15. The method of claim 10, wherein the first conductive redistribution pattern further comprises a first seed layer that encompasses a side wall of the first conductive via pattern and is in contact with the top surface of the lower electrode pad, and
    the second conductive redistribution pattern further comprises a second seed layer that encompasses a side wall of the second conductive via pattern and is in contact with the first conductive line pattern.

16. The method of claim 10, further comprising:
forming a third redistribution insulating layer on the second redistribution insulating layer, the third redistribution insulating layer covering the second conductive line pattern; and
forming a third conductive redistribution pattern electrically connected to the second conductive redistribution pattern,
wherein the third conductive redistribution pattern comprises:
a third conductive line pattern extending along a top surface of the third redistribution insulating layer; and
a third conductive via pattern extending between the third conductive line pattern and the second conductive line pattern, and
wherein a chip connection terminal is provided between a chip pad of the semiconductor chip and the third conductive line pattern.

17. A method of manufacturing a semiconductor package, the method comprising:
forming a lower electrode pad on a carrier substrate;
forming a redistribution structure on the carrier substrate, the redistribution structure comprising a redistribution insulating layer and a conductive redistribution pattern that is electrically connected to the lower electrode pad;
mounting a semiconductor chip on the redistribution structure;
removing the carrier substrate; and
removing part of the redistribution insulating layer such that the lower electrode pad has a first portion embedded in the redistribution insulating layer and a second portion protruding from a bottom surface of the redistribution insulating layer,
wherein a thickness of the first portion of the lower electrode pad is greater than a thickness of the second portion of the lower electrode pad, and
wherein the forming of the redistribution structure comprises:
forming a first redistribution insulating layer in contact with a top surface and a side wall of the lower electrode pad and having a via opening that exposes part of the top surface of the lower electrode pad;
forming a first seed layer in contact with the top surface of the first redistribution insulating layer, a side wall of the first redistribution insulating layer that defines the via opening, and the top surface of the lower electrode pad; and
forming a first conductive line pattern extending along the top surface of the first redistribution insulating layer and a first conductive via pattern provided in the via opening of the first redistribution insulating layer.

18. The method of claim 17, wherein the lower electrode pad has a uniform thickness, the top surface of the lower electrode pad is flat, and a bottom surface opposite to the top surface of the lower electrode pad is flat.

19. The method of claim 17, further comprising forming an external connection terminal that is attached to the bottom surface of the lower electrode pad.

20. The method of claim 17, wherein a width of the via opening decreases toward the top surface of the lower electrode pad.

* * * * *